(12) United States Patent
Bang et al.

(10) Patent No.: US 12,341,371 B2
(45) Date of Patent: Jun. 24, 2025

(54) DEVICE AND METHOD OF DETECTING ATTACHMENT AND DETACHMENT OF PORTABLE DEVICE

(71) Applicant: Samsung Electronics Co., Ltd., Suwon-si (KR)

(72) Inventors: Sangun Bang, Seongnam-si (KR); Duseung Oh, Hwaseong-si (KR); Dongjo Kim, Suwon-si (KR); Dongjoon Kim, Seoul (KR); Jinsoo Lee, Hwaseong-si (KR); Sungkyu Cho, Hwaseong-si (KR); Woonhyung Heo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 546 days.

(21) Appl. No.: 17/315,834

(22) Filed: May 10, 2021

(65) Prior Publication Data

US 2022/0060041 A1 Feb. 24, 2022

(30) Foreign Application Priority Data

Aug. 21, 2020 (KR) .................. 10-2020-0105536

(51) Int. Cl.
*G01R 31/68* (2020.01)
*H02J 7/00* (2006.01)

(52) U.S. Cl.
CPC ........ *H02J 7/007182* (2020.01); *G01R 31/68* (2020.01); *H02J 7/0049* (2020.01)

(58) Field of Classification Search
CPC .... H02J 7/007182; H02J 7/0049; G01R 31/68

USPC ........................................................ 320/162
See application file for complete search history.

(56) References Cited

U.S. PATENT DOCUMENTS

| | | | |
|---|---|---|---|
| 6,995,963 B2 | 2/2006 | Fadell et al. | |
| 8,237,414 B1 * | 8/2012 | Li | H02J 7/00047 320/160 |
| 8,461,807 B2 | 6/2013 | Senriuchi et al. | |
| 9,130,659 B2 | 9/2015 | Nii et al. | |
| 9,197,100 B2 | 11/2015 | Ichikawa | |
| 9,312,576 B2 | 4/2016 | Hung et al. | |

(Continued)

FOREIGN PATENT DOCUMENTS

| | | |
|---|---|---|
| JP | 2009-027479 A | 2/2009 |
| JP | 2010-041303 A | 2/2010 |

(Continued)

*Primary Examiner* — Drew A Dunn
*Assistant Examiner* — Pamela J Jeppson
(74) *Attorney, Agent, or Firm* — Harness, Dickey & Pierce, P.L.C.

(57) ABSTRACT

A device for detecting an attachment and detachment of a portable device according to example embodiments of the present disclosure may include a first terminal and a second terminal configured to be connected to the portable device; a pull-up circuit connected to the first terminal; a charging circuit configured to generate an output voltage for charging the portable device; and a controller configured to control the charging circuit to generate the output voltage when a voltage of the first terminal drops in a detachment state, and determine whether to transition to an attachment state based on an output current output through the first terminal during a first period in which the output voltage is generated.

17 Claims, 22 Drawing Sheets

(56) References Cited

U.S. PATENT DOCUMENTS

| | | | |
|---|---|---|---|
| 9,466,860 B2* | 10/2016 | Noda | H02J 7/02 |
| 9,843,853 B2 | 12/2017 | Hirsch et al. | |
| 9,908,420 B2 | 3/2018 | Lee et al. | |
| 10,104,463 B2 | 10/2018 | Kim et al. | |
| 10,560,576 B1 | 2/2020 | Kim et al. | |
| 11,139,688 B2 | 10/2021 | Kang et al. | |
| 2004/0109499 A1* | 6/2004 | Cern | H04B 3/542 |
| | | | 375/222 |
| 2004/0113587 A1* | 6/2004 | Bohne | H02J 7/00047 |
| | | | 320/128 |
| 2008/0049606 A1 | 2/2008 | Rhelimi et al. | |
| 2008/0246433 A1* | 10/2008 | Kim | H01M 10/46 |
| | | | 320/103 |
| 2009/0184688 A1* | 7/2009 | Kim | G06F 1/26 |
| | | | 320/137 |
| 2010/0026247 A1* | 2/2010 | Kim | H02J 7/0036 |
| | | | 320/162 |
| 2010/0039066 A1* | 2/2010 | Yuan | H02J 7/00302 |
| | | | 320/108 |
| 2010/0175094 A1 | 7/2010 | Ono | |
| 2011/0221604 A1 | 9/2011 | Johnson | |
| 2012/0256596 A1* | 10/2012 | Wada | H02J 7/00045 |
| | | | 320/137 |
| 2013/0038274 A1* | 2/2013 | Forsythe | H02J 7/0071 |
| | | | 320/162 |
| 2013/0320947 A1* | 12/2013 | Noh | G05F 1/10 |
| | | | 323/283 |
| 2014/0306660 A1* | 10/2014 | Suzuki | H02J 7/0045 |
| | | | 320/110 |
| 2014/0333262 A1 | 11/2014 | Ochiai et al. | |
| 2015/0311806 A1* | 10/2015 | Kim | H02M 3/33507 |
| | | | 363/21.17 |
| 2015/0326969 A1 | 11/2015 | Tu et al. | |
| 2015/0365132 A1 | 12/2015 | Yu | |
| 2016/0006292 A1 | 1/2016 | Hatanaka et al. | |
| 2016/0080141 A1 | 3/2016 | Theiler et al. | |
| 2017/0093454 A1* | 3/2017 | Chawan | H04R 1/1025 |
| 2017/0166073 A1 | 6/2017 | Park | |
| 2018/0248414 A1 | 8/2018 | Liu et al. | |
| 2018/0312072 A1 | 11/2018 | Yang et al. | |
| 2019/0075385 A1 | 3/2019 | Lee et al. | |
| 2019/0098396 A1 | 3/2019 | Shin et al. | |
| 2019/0289382 A1 | 9/2019 | Chawan et al. | |
| 2020/0052526 A1 | 2/2020 | Ueda | |

FOREIGN PATENT DOCUMENTS

| | | |
|---|---|---|
| JP | 3193355 U | 9/2014 |
| JP | 2015-076954 A | 4/2015 |
| JP | 2019-220882 A | 12/2019 |
| KR | 10-20130098521 A | 9/2013 |
| KR | 10-20170033941 A | 3/2017 |
| KR | 10-2018-0093322 A | 8/2018 |
| KR | 10-2071268 B1 | 1/2020 |
| KR | 10-2020-0016636 A | 2/2020 |

* cited by examiner

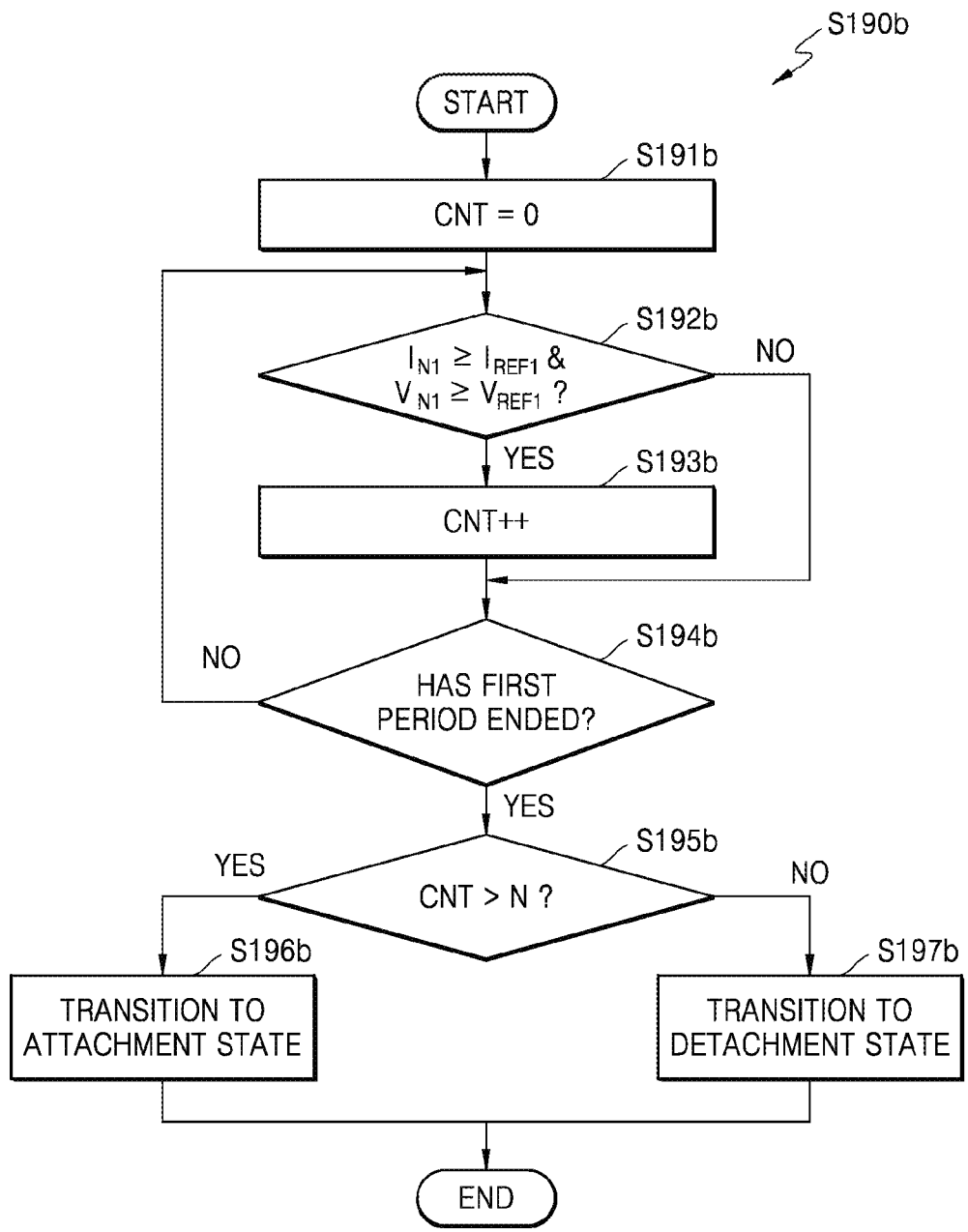

DEVICE AND METHOD OF DETECTING ATTACHMENT AND DETACHMENT OF PORTABLE DEVICE

CROSS-REFERENCE TO RELATED APPLICATION

This application is based on and claims priority under 35 U.S.C. § 119 to Korean Patent Application No. 10-2020-0105536, filed on Aug. 21, 2020, in the Korean Intellectual Property Office, the disclosure of which is incorporated by reference herein in its entirety.

BACKGROUND

The technical idea of the present disclosure relates to a portable device including a battery, and particularly, to a device and method of detecting the attachment and detachment of the portable device.

Portable devices including batteries are widely used. The portable devices may have a structure to replace the battery when the battery is exhausted, or may include a rechargeable battery. The rechargeable battery included in the portable device may be charged from electric power provided from a charger connected to the portable device. Chargers as well as the portable devices may be miniaturized, and chargers with higher efficiency may be required.

SUMMARY

The technical idea of the present disclosure provides a device and method for accurately and/or efficiently detecting a portable device.

A device for detecting an attachment and detachment of a portable device according to an aspect of the technical idea of the present disclosure may include a first terminal and a second terminal configured to be connected to the portable device; a pull-up circuit connected to the first terminal; a charging circuit configured to generate an output voltage for charging the portable device; and a controller configured to control the charging circuit to generate the output voltage when a voltage of the first terminal drops in a detachment state, and determine whether to transition to an attachment state based on an output current output through the first terminal during a first period in which the output voltage is generated.

A portable system according to an aspect of the technical idea of the present disclosure, may include a portable charger including a first terminal and a second terminal; and a portable device including a third terminal and a fourth terminal configured to contact the first terminal and the second terminal respectively when attached to the portable charger, wherein the portable device includes a pull-down circuit connected to the third terminal, and the portable charger includes a pull-up circuit connected to the first terminal; a charging circuit configured to generate an output voltage for charging the portable device; and a controller configured to initiate detection of attachment of the portable device when the voltage of the first terminal drops.

A method of detecting the mounting and removal of a portable device according to an aspect of the technical idea of the present disclosure may include pulling up a first terminal configured to be connected to the portable device, and sensing a voltage drop of the first terminal, in a detachment state; outputting an output voltage for charging the portable device to the first terminal, and starting a first period, when sensing the voltage drop; and determining whether to transition to an attachment state based on an output current being output through the first terminal during the first period.

BRIEF DESCRIPTION OF THE DRAWINGS

Example embodiments of the inventive concepts will be more clearly understood from the following detailed description taken in conjunction with the accompanying drawings in which:

FIGS. 6A through 6B are flowcharts illustrating examples of a method of detecting attachment of a portable device according to example embodiments of the present disclosure;

DETAILED DESCRIPTION

Figure 1:
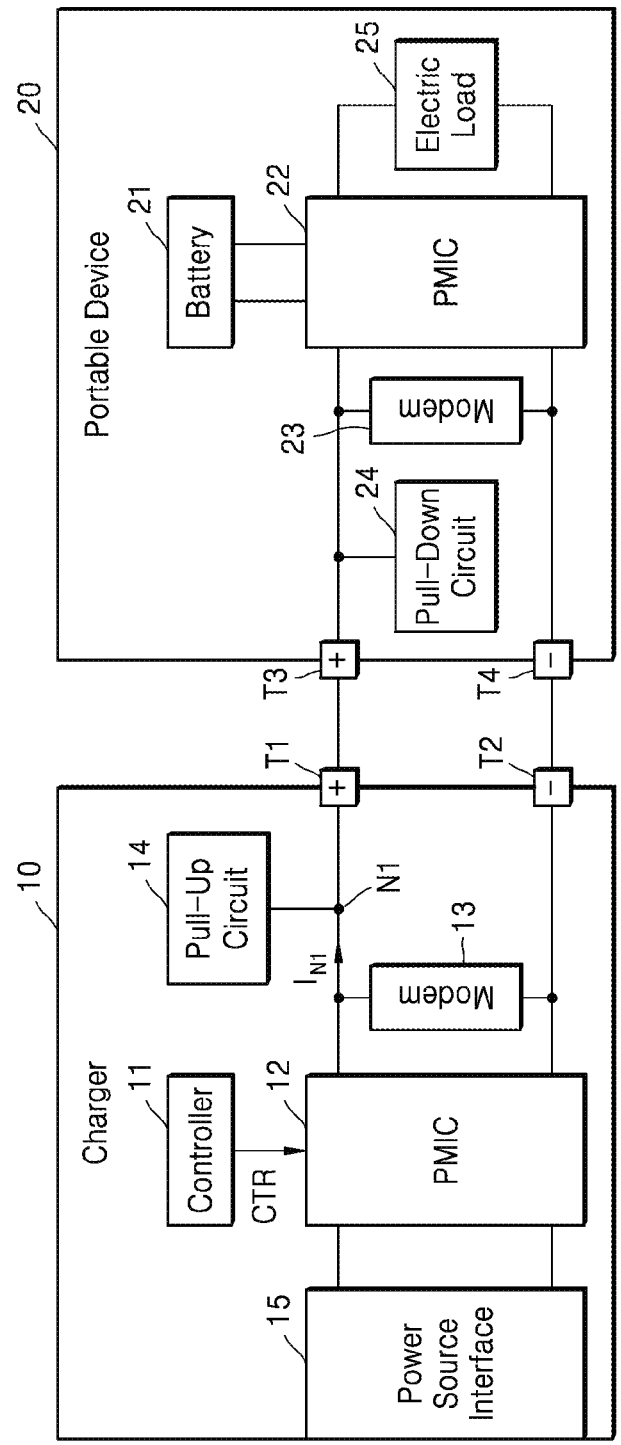
FIG. 1 is a block diagram illustrating a charger and a portable device according to example embodiments of the present disclosure.

FIG. 1 is a block diagram showing a charger 10 and a portable device 20 according to example embodiments of the present disclosure. As shown in FIG. 1, the charger 10 may include a first terminal T1 and a second terminal T2, and the portable device 20 may include a third terminal T3 electrically connected to the first terminal T1 and a fourth terminal T4 electrically connected to the second terminal T2. The portable device 20 may be detachably connected to the charger 10. In an example embodiment, when the first terminal T1 and the second terminal T2 are electrically connected to the third terminal T3 and the fourth terminal T4, respectively, the portable device 20 may be referred to as attached to the charger 10. When the first terminal T1 is electrically disconnected from the third terminal T3 or the second terminal T2 is electrically disconnected from the fourth terminal T4, the portable device 20 may be referred to as detached from the charger 10. The portable device 20 attached to the charger 10 may be charged by the charger 10.

The charger (or charging device) 10 may provide power to the portable device 20 based on power provided from an external power source. In some example embodiments, the charger 10 may receive an AC voltage from the power source and may provide a DC voltage generated from the AC voltage to the portable device 20. In some example embodiments, the charger 10 may receive a first DC voltage from the power source and may provide a second DC voltage generated from the first DC voltage to the portable device 20. As shown in FIG. 1, the charger 10 may include a controller 11, a power management integrated circuit (PMIC) 12, a modem 13, a pull-up circuit 14, and/or a power source interface 15. In some example embodiments, the controller 11, the PMIC 12, the modem 13, the pull-up circuit 14, and the power source interface 15 may be integrated circuits, which may be included in a single package, or in two or more packages mounted on a printed circuit board, respectively. The first terminal T1 and the second terminal T2 of the charger 10 may be electrically connected to the third terminal T3 and the fourth terminal T4 of the portable device 20, respectively, through a medium such as a cable, or may directly contact the third terminal T3 and the fourth terminal T4 of the portable device 20, respectively. In an example embodiment, it is assumed that the first terminal T1 and the third terminal T3 have a potential higher than that of the second terminal T2 and the fourth terminal T4, respectively. In addition, as shown in FIG. 1, the node to which the first terminal T1 is connected may be referred to as a first node N1, the current output from the PMIC 12 and the modem 13 through the first terminal T1 may be referred to as an output current $I_{N1}$, and the voltage $V_{N1}$ of the first node N1 may be referred to as the voltage of the first terminal T1.

The PMIC 12 may be connected to the power source interface 15, the first terminal T1 and the second terminal T2, and may receive a control signal CTR from the controller 11. The charger 10 may generate an output voltage for charging the portable device 20 from power provided through the power source interface 15 based on the control signal CTR. For example, the PMIC 12 may include at least one voltage regulator for generating a DC voltage, at least one sensor for sensing current and/or voltage, at least one power switch for selectively blocking voltage and/or current, and at least one passive element such as a capacitor and/or a diode. In some example embodiments, when the PMIC 12 receives an AC voltage through the power source interface 15, the PMIC 12 may include a converter for generating a DC voltage from the AC voltage. The PMIC 12 of the charger 10 may also be referred to as a charging circuit.

The modem 13 may be connected to the first terminal T1 and the second terminal T2, and may perform power line communication (PLC) with the portable device 20 through the first terminal T1 and/or the second terminal T2. For example, the modem 13 may transmit a packet generated by encoding and modulating data provided from the controller 11 to the portable device 20, and provide data generated by decoding and demodulating the packet received from the portable device 20 to the controller 11. An example of the modem 13 will be described later with reference to FIG. 4.

The pull-up circuit 14 may be connected to the first terminal T1 and pull-up the potential of the first terminal T1. For example, different from that shown in FIG. 1, when the portable device 20 is detached from the charger 10, the PMIC 12 may stop generating the output voltage and the first terminal T1 may have a voltage (e.g., 1 V or more) higher than the voltage of the second terminal T2 by the pull-up circuit 14. On the other hand, as shown in FIG. 1, when the portable device 20 is attached to the charger 10, the voltage of the first terminal T1 may be reduced by a pull-down circuit 24 of the portable device 20 to be described later. An example of the pull-up circuit 14 will be described later with reference to FIG. 3, and the pull-up of the potential of the first terminal T1 may be simply referred to as a pull-up of the first terminal T1.

The power source interface 15 may be connected to a power source external to the charger 10 and may provide power supplied from the power source to the PMIC 12. In some example embodiments, the power source interface 15 may include two or more terminals connected to the power source. In some example embodiments, the power source interface 15 may receive power from the power source through wireless charging, include a coil and/or an antenna for this purpose, and include a circuit for converting energy induced in the coil and/or antenna into electric power.

The controller 11 may communicate with the portable device 20 through the modem 13 and control the PMIC 12 through the control signal CTR. For example, the controller 11 may identify information, status, etc. of the portable device 20 based on data received from the portable device 20 through the modem 13, and may transmit data including information, status, etc. of the charger 10 to the portable device 20 through the modem 13. For example, the controller 11 may control the PMIC 12 based on information and/or status of the portable device 20, and the power provided to the portable device 20 may be adjusted by controlling the PMIC. The controller 11 may include a logic circuit including a state machine, a memory storing a series of instructions, and at least one processor configured to execute the instructions.

In addition, the controller 11 may determine the attachment and detachment of the portable device 20. For example, the controller 11 may determine a state in which the portable device 20 is attached to the charger 10, that is, an attachment state, and generate the control signal CTR so that an output voltage for charging the battery 21 included in the portable device 20 is generated in the attachment state. In addition, the controller 11 may determine a state in which the portable device 20 is detached from the charger 10, that is, a detachment state, and generate a control signal CTR so that generation of an output voltage for charging the portable device 20 is blocked in the detachment state. An example in which the controller 11 determines the attachment state and the detachment state will be described later with reference to FIG. 2.

The portable device 20 may include a battery 21 and may be referred to as any device capable of independently operating based on the power provided from the battery 21. For example, the portable device 20 may include a computing device such as a laptop computer, a tablet PC, and a mobile phone, an input/output device such as a wireless keyboard, a wireless mouse, and a wireless speaker, a wearable device such as a smart glass, a smart watch, a smart band, and a wireless earphone, and a transport device such as an electric vehicle, an electric bicycle, and an electric kickboard. The battery 21 included in the portable device 20 may be a rechargeable battery and may be charged from electric power provided from the charger 10. The rechargeable battery may be simply referred to as a battery, and charging of the battery 21 included in the portable device 20 may be referred to simply as charging of the portable device 20. As shown in FIG. 1, the portable device 20 may include a PMIC 22, a modem 23, the pull-down circuit 24 and an electric load 25 as well as a battery 21 and may include the third terminal T3 and the fourth terminal T4 respectively connected to the first terminal T1 and the second terminal T2 of the charger 10.

The PMIC 22 may charge the battery 21 from power provided from the charger 10 and may provide power to the electric load 25. In addition, the PMIC 22 may provide power provided from the battery 180 to the electric load 25. For example, the PMIC 22 may charge the battery 21 by supplying at least part of the power provided from the charger 10 to the battery 21 in the attachment state, and may cut off power supplied to the battery 180 when charging of the battery 21 is completed. In addition, the PMIC 22 may provide power provided from the battery 21 to the electric load 25 in the detachment state, and may cut off power supplied to the electric load 25 when the battery 21 is overdischarged.

The modem 23 may be connected to the third terminal T3 and the fourth terminal T4, and may perform power line communication with the charger 10, that is, the modem 13 of the charger 10 through the third terminal T3 and/or the fourth terminal T4. For example, the modem 23 may transmit a packet generated by encoding and modulating data provided from the PMIC 22 and/or the electric load 25 to the charger 10, and may provide data generated by decoding and demodulating the packet received from the charger 10 to the PMIC 22 and/or the electric load 25.

The electric load 25 may perform an operation for a function, which the portable device 20 provides, based on the power supplied from the PMIC 22. For example, the electric load 25 may include a transceiver for wireless communication, may include elements for outputting light, sound, vibration, etc., and a controller for controlling the portable device 20. In some example embodiments, the modem 23 may also operate based on power supplied from the PMIC 22 and may be referred to as being included in the electric load 25. The electric load may also be referred to as a load or a load circuit.

The pull-down circuit 24 may be connected to the third terminal T3 and pull down the potential of the third terminal T3. For example, differently as shown in FIG. 1, when the portable device 20 is detached from the charger 10, the PMIC 22 may disconnect the third terminal T3 from the battery 21 and the electric load 25, and the third terminal T3 may have approximately the same voltage as the fourth terminal T4 by the pull-down circuit 24. On the other hand, as shown in FIG. 1, when the portable device 20 is attached to the charger 10, the voltage of the third terminal T3 may be increased by the pull-up circuit 14 of the charger 10. An example of the pull-down circuit 24 will be described later with reference to FIG. 3, and the pull-down of the potential of the third terminal T3 may be simply referred to as a pull-down of the third terminal T3.

Figure 2:
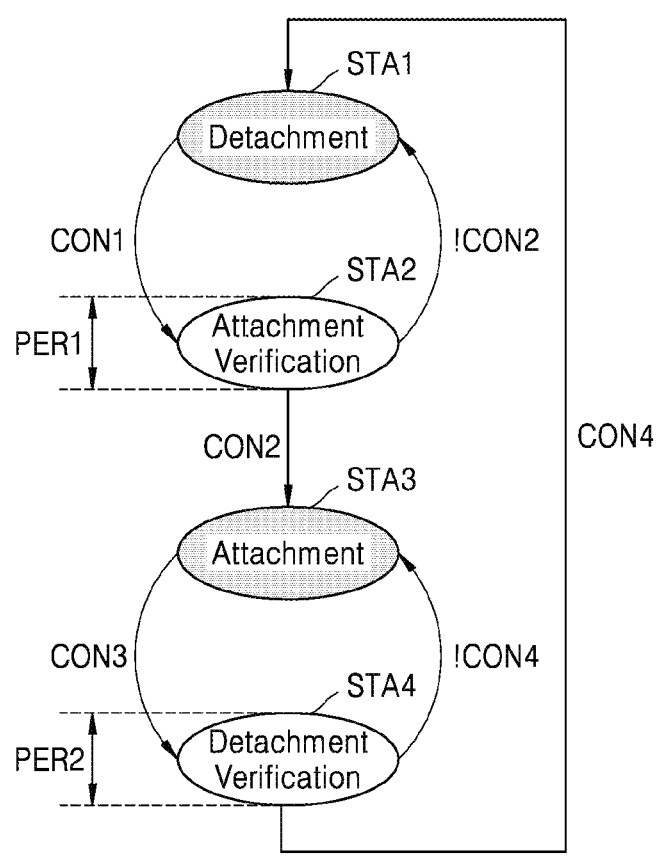
FIG. 2 is a state diagram showing states according to example embodiments of the present disclosure.

FIG. 2 is a state diagram showing states according to example embodiments of the present disclosure. In some example embodiments, the controller 11 of FIG. 1 may detect the attachment and detachment of the portable device 20 based on the states of FIG. 2. Hereinafter, FIG. 2 will be described with reference to FIG. 1.

Referring to FIG. 2, in a detachment state STA1, when a first condition CON1 is satisfied, a transition to an attachment verification state STA2 may occur. For example, when a voltage drop occurs at the first terminal T1 pulled up by the pull-up circuit 14 in the detachment state STA1, the controller 11 may determine the transition from the detachment state STA1 to the attachment verification state STA2. When the third terminal T3 of the portable device 20 is electrically connected to the first terminal T1, as described above with reference to FIG. 1, the potential of the first terminal T1 may be reduced by the pull-down circuit 24, and accordingly, the controller 11 may determine a transition to the attachment verification status STA2 to verify the attachment of the portable device 20. As described above with reference to FIG. 1, the controller 11 may control the PMIC 12 to block generation of the output voltage through the control signal CTR in the detachment state STA1.

In the attachment verification state STA2, a transition to an attachment state STA3 may occur when a second condition CON2 is satisfied, while a transition to the detachment state STA1 may occur when the second condition CON2 is not satisfied. For example, the controller 11 may verify the attachment of the portable device 20 based on the output current $I_{N1}$ and/or the voltage $V_{N1}$ of the first node N1. In some example embodiments, the output current $I_{N1}$ and/or the voltage $V_{N1}$ of the first node N1 may be detected by a sensor included in the modem 13, and accordingly, an additional circuit for detecting the portable device 20 may be omitted. As shown in FIG. 2, the verification of the attachment may be performed during a first period PER1, and the first period PER1 may be initiated when a transition from the detachment state STA1 to the attachment verification state STA2 is performed. The controller 11 may determine whether the second condition CON2 is satisfied when the first period PER1 ends, based on the output current $I_{N1}$ and/or the voltage $V_{N1}$ of the first node N1 sensed during the first period PER1. In some example embodiments, the first period PER1 may correspond to several hundred milliseconds (ms). In the attachment verification state STA2, the controller 11 may detect the attachment of the portable device 20 by filtering events that are not caused by the attachment of the portable device 20. Examples of operations performed in the attachment verification state STA2 will be described later with reference to FIGS. 5, 6A, and 6B.

In the attachment state STA3, when a third condition CON3 is satisfied, a transition to a detachment verification state STA4 may occur. For example, the controller 11 may determine a transition to the detachment verification state STA4 when a decrease in the output current $I_{N1}$ occurs in the attachment state STA3. When the third terminal T3 and/or the fourth terminal T4 of the portable device 20 are electrically disconnected from the first terminal T1 and/or the second terminal T2, the output current $I_{N1}$ may decrease, and accordingly, the controller 11 may determine a transition to the detachment verification state STA4 to verify detachment of the portable device 20. As described above with reference to FIG. 1, the controller 11 may control the PMIC 12 to generate an output voltage through the control signal CTR in the attachment state STA3.

In the detachment verification state STA4, a transition to the detachment state STA1 may occur when a fourth condition CON4 is satisfied, while a transition to the attachment state STA3 may occur when the fourth condition CON4 is not satisfied. For example, the controller 11 may verify the detachment of the portable device 20 based on the output current $I_{N1}$ and/or the voltage $V_{N1}$ of the first node N1. As shown in FIG. 2, the verification of the detachment may be performed during a second period PER2, and the second period PER2 may be initiated when a transition from the attachment state STA3 to the detachment verification state STA4 is performed. The controller 11 may determine whether the fourth condition CON4 is satisfied when the second period PER2 ends, based on the output current $I_{N1}$ and/or the voltage $V_{N1}$ of the first node N1 sensed during the first period PER2. In the detachment verification state STA4, the controller 11 may detect detachment of the portable device 20 by filtering events not caused by detachment of the portable device 20. Examples of operations performed in the detachment verification state STA4 will be described later with reference to FIGS. 7, 8A, and 8B.

Figure 3:
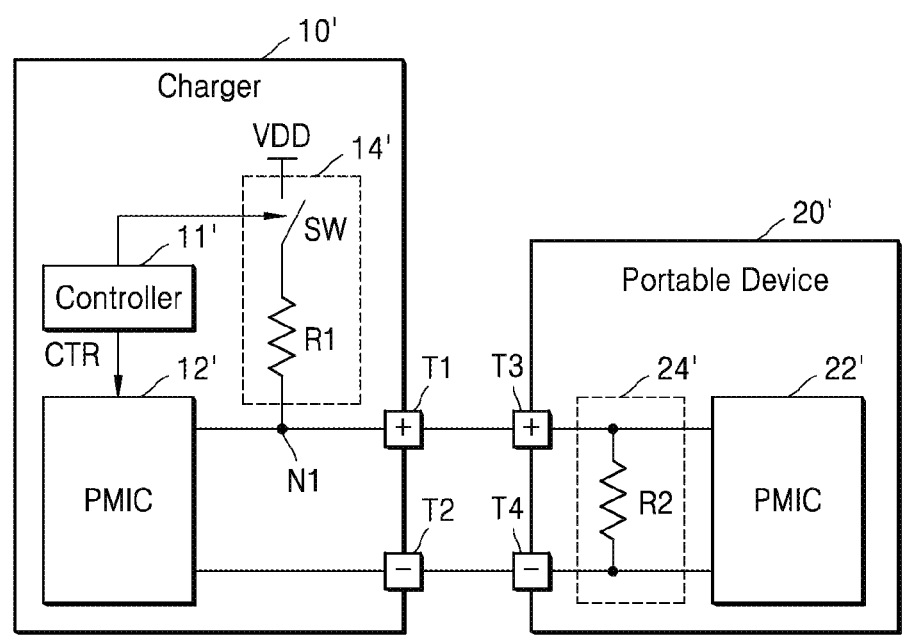
FIG. 3 is a block diagram showing a charger and a portable device according to example embodiments of the present disclosure.

FIG. 3 is a block diagram illustrating a charger 10' and a portable device 20' according to example embodiments of the present disclosure. Hereinafter, in the description of FIG. 3, descriptions previously given with respect to FIG. 1 will be omitted.

Referring to FIG. 3, similar to the charger 10 of FIG. 1, the charger 10' of FIG. 3 may include a controller 11', a PMIC 12', and/or a pull-up circuit 14'. The pull-up circuit 14' may include a switch SW and a first resistor R1 connected in series between the positive supply voltage VDD and the first node N1. In some example embodiments, different from that shown in FIG. 3, the pull-up circuit 14' may further include a diode connected in series with the switch SW and the first resistor R1. The switch SW may receive a second control signal CTR2 from the controller 11', may be turned on in response to the activated second control signal CTR2, and may be turned off in response to the deactivated second control signal CTR2. For example, the switch SW may be a field effect transistor (FET) having a gate receiving the second control signal CTR2. In some example embodiments, the positive supply voltage VDD may be generated by the PMIC 12', and may be a voltage provided to the modem (e.g., the modem 13 in FIG. 1). In some example embodiments, different from that shown in FIG. 3, the switch SW of the pull-up circuit 14' and the second control signal CTR2 may be omitted, and accordingly, the first resistor R1 may always pull up the potential of the first node N1.

The controller 11' may generate a first control signal CTR1 and a second control signal CTR2. The controller 11' may control the PMIC 12' through the first control signal CTR1, and may control the pull-up circuit 14' through the second control signal CTR2. For example, the controller 11' may generate an activated second control signal CTR2 in the detachment state STA1 of FIG. 2 and a deactivated second control signal CTR2 in the attachment state STA3 of FIG. 2.

Referring to FIG. 3, the portable device 20' may include a PMIC 22' and a pull-down circuit 24', similar to the portable device 20 of FIG. 1. The pull-down circuit 24' may include a second resistor R2, and the second resistor R2 may be connected to the third terminal T3 and the fourth terminal T4. In some example embodiments, different from that shown in FIG. 3, the pull-down circuit 24' may further include a switch and/or a diode connected in series with the second resistor R2 between the third terminal T3 and the fourth terminal T4.

The first resistance R1 of the pull-up circuit 14' and the second resistance R2 of the pull-down circuit 24' may have appropriate resistances so that a voltage drop occurs at the first terminal T1 when the portable device 20' is attached to the charger 10', respectively. For example, a resistance of the first resistor R1 may be greater than a resistance of the second resistor R2. In addition, the first resistor R1 and the second resistor R2 may be relatively large resistances, such as tens kilohms (k$\Omega$) or hundreds of kilohms (k$\Omega$), in order to reduce current consumption in the attachment state STA1 and the detachment state STA3 of FIG. 2.

Figure 4:
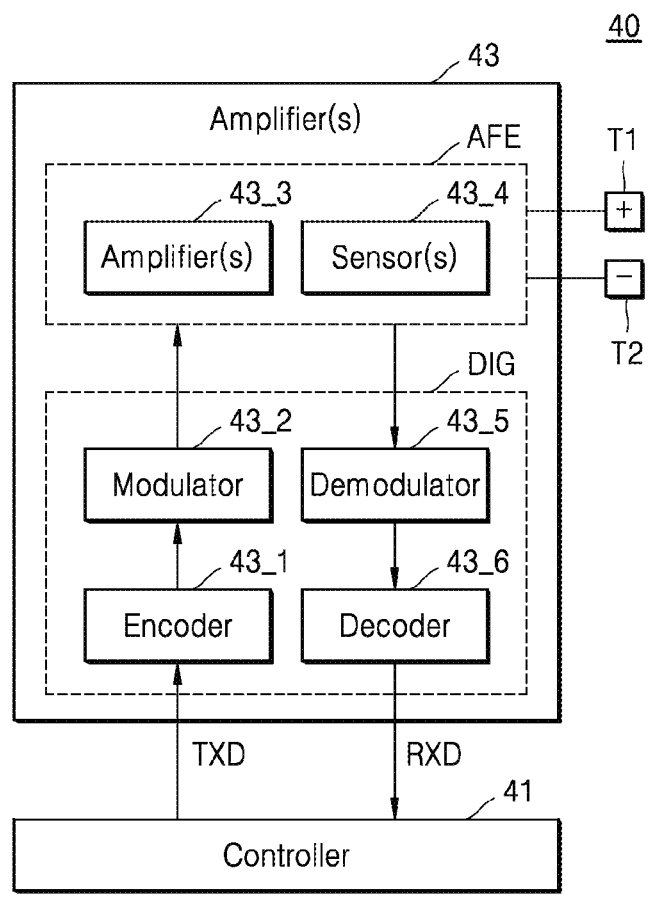
FIG. 4 is a block diagram showing a charger according to example embodiments of the present disclosure.

FIG. 4 is a block diagram showing a charger 40 according to example embodiments of the present disclosure. Similar to the charger 10 of FIG. 1, the charger 40 of FIG. 4 may include a controller 41 and a modem 43, and may include a first terminal T1 and a second terminal T2. Hereinafter, in the description of FIG. 4, descriptions previously given with respect to FIG. 1 will be omitted.

The modem 43 may be connected to the first terminal T1 and the second terminal T2, may generate a packet from the first data TXD provided from the controller 41 and may transmit the generated packet through the first terminal T1 and/or the second terminal T2, or may generate second data RXD from a packet received through the first terminal T1 and/or the second terminal T2 and provide the generated packet to the controller 41. As shown in FIG. 4, the modem 43 may include an encoder 43_1, a modulator 43_2, at least one amplifier 43_3, at least one sensor 43_4, a demodulator 43_5, and/or a decoder 43_6. As shown in FIG. 4, the at least one amplifier 43_3 and the at least one sensor 43_4 may be collectively referred to as an analog front-end circuit (AFE), and the encoder 43_1, the modulator 43_2, the demodulator 43_5, and the decoder 43_6 may be collectively referred to as a digital circuit DIG.

The encoder 43_1 may receive the first data TXD from the controller 41. The encoder 43_1 may encode the first data TXD according to a format shared with the portable device (e.g., the portable device 20 of FIG. 1), and may provide the encoded data to the modulator 43_2. In some example embodiments, the encoder 43_1 may further encode the header as well as the first data TXD. The modulator 43_2 may modulate the encoded data according to a modulation method shared with the portable device, and may provide the modulated signal to the analog front end circuit AFE. At least one amplifier 43_3 of the analog front-end circuit AFE may output a signal based on the modulated signal to the first terminal T1 and/or the second terminal T2. For example, at least one amplifier 43_3 may output a signal based on voltage modulation.

At least one sensor 43_4 of the analog front-end circuit AFE may provide a modulated signal received through the first terminal T1 and/or the second terminal T2 to the demodulator 43_5. For example, at least one sensor 43_4 may provide the received signal to the demodulator 43_5 based on current modulation. The demodulator 43_5 may demodulate the modulated signal according to a modulation method shared with the portable device, and may provide the demodulated signal to the decoder 43_6. The decoder 43_6 may decode the demodulated signal according to a format shared with the portable device, and may provide the decoded second data RXD to the controller 41. In some example embodiments, the decoder 43_6 may further decode the header as well as the second data RXD. In addition, in some example embodiments, the decoder 43_6 may further provide error information generated during reception to the controller 41.

As described above with reference to FIG. 1, at least one sensor 43_4 included in the analog front end circuit AFE of the modem 43 may be used to detect attachment and detachment of a portable device. Accordingly, an additional circuit for detecting the portable device 20 may be omitted, and the charger 40 may have a simple structure.

Figure 5:
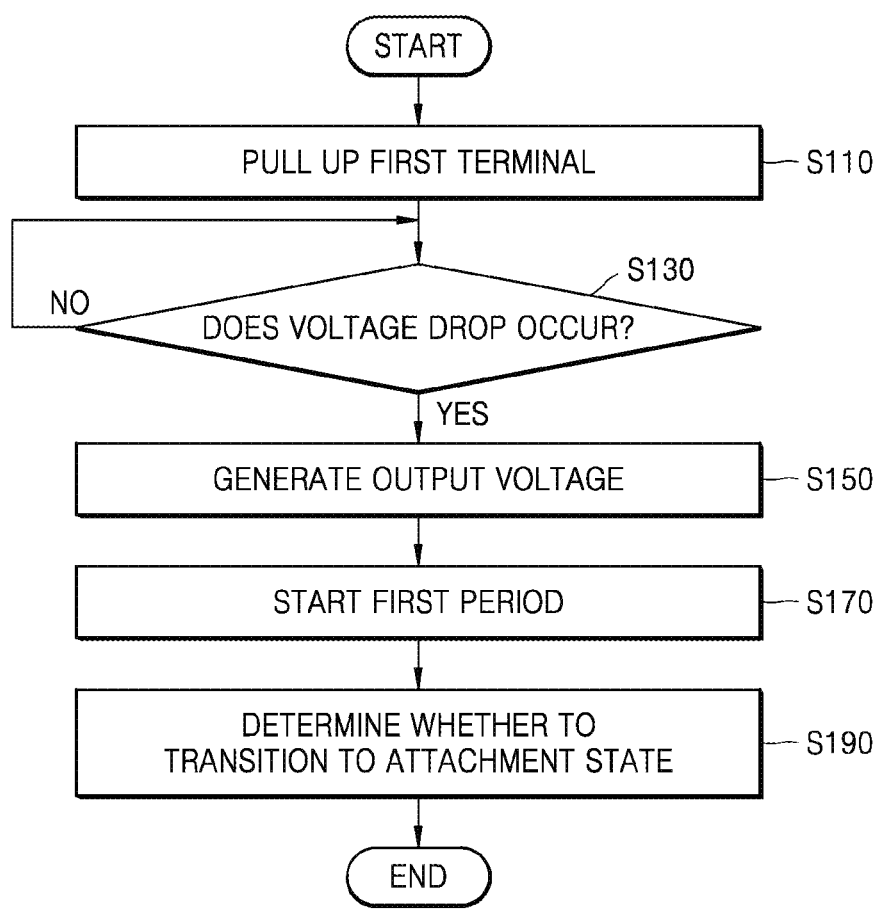
FIG. 5 is a flowchart showing a method of detecting attachment of a portable device according to example embodiments of the present disclosure.

FIG. 5 is a flow chart showing a method of detecting attachment of a portable device according to example embodiments of the present disclosure. As shown in FIG. 5, the method of detecting the attachment of the portable device may include a plurality of operations S110, S130, S150, S170, and S190. In some example embodiments, the method of FIG. 5 may be performed by the charger 10 of FIG. 1 in the detachment state, and FIG. 5 will be described below with reference to FIG. 1.

In operation S110, the first terminal T1 may be pulled up. For example, the first terminal T1 may be pulled up by the pull-up circuit 14, and thus may have a higher potential than the second terminal T2. In some example embodiments, as described above with reference to FIG. 3, the controller 11 may also enable the pull-up circuit 14. In some example embodiments, the voltage $V_{N1}$ of the first node N1 may be pulled up to about 1.6 V by the pull-up circuit 14. Operation S110 may correspond to the detachment state STA1 of FIG. 2.

In operation S130, it may be determined whether a voltage drop occurs at the first terminal T1. For example, the controller 11 may identify the occurrence of a voltage drop at the first node N1 by a sensor included in the modem 13. In some example embodiments, when the voltage $V_{N1}$ of the first node N1 pulled up to 1.6 V becomes about 0.8 V or less, the controller 11 may determine a voltage drop at the first terminal T1. As shown in FIG. 5, when a voltage drop occurs, operation S150 may be performed subsequently.

In operation S150, an output voltage may be generated. For example, the controller 11 may generate a control signal CTR such that the PMIC 12 generates an output voltage for charging the portable device 20. Accordingly, an output voltage may be applied to the first terminal T1 and the second terminal T2. In some example embodiments, the output voltage may have a magnitude of about 4.5 V, and the voltage between the first terminal T1 and the second terminal T2 may be close to the output voltage and may be less than the output voltage.

In operation S170, the first period PER1 may be started. As described above with reference to FIG. 2, the first period PER1 may correspond to a period in which the attachment verification state STA2 is maintained. For example, the controller 11 may include a timer synchronized with a clock signal, and may start the first period PER1 by initializing the timer.

In operation S190, it may be determined whether to transition to the attachment state. For example, the controller 11 may determine whether to transition to the attachment state when the first period PER1 ends, based on the output current $I_{N1}$ sensed during the first period PER1 and/or the voltage $V_{N1}$ of the first node N1, Examples of operation S190 will be described with reference to FIGS. 6A and 6B.

Figure 6A:
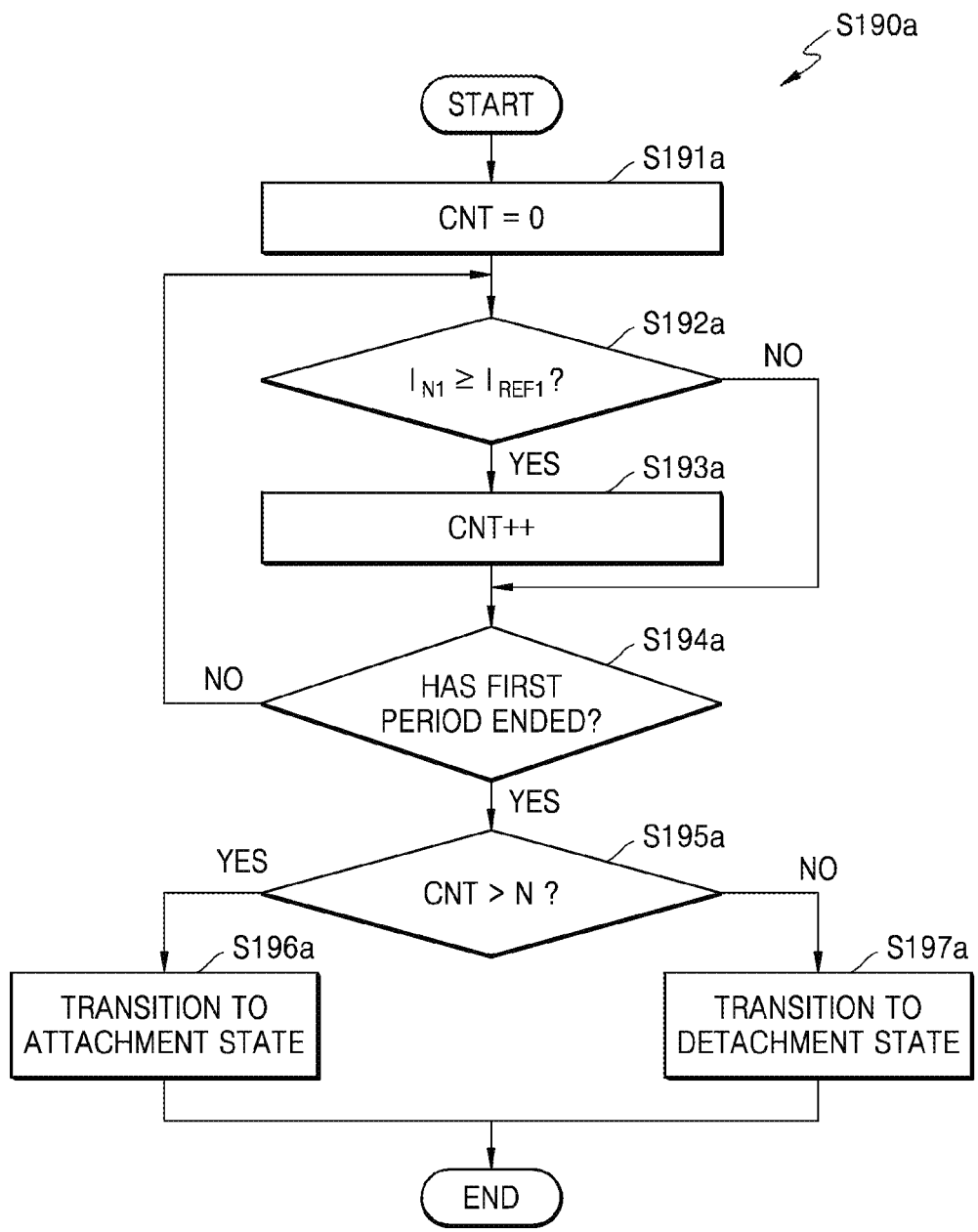

FIGS. 6A and 6B are flowcharts illustrating examples of a method of detecting attachment of a portable device according to example embodiments of the present disclosure. In detail, the flowcharts of FIGS. 6A and 6B show examples of operation S190 of FIG. 5. As described above with reference to FIG. 5, when the first period PER1 ends, it may be determined whether a transition to the attachment state is performed in operation S190a of FIG. 6A and operation S190b of FIG. 6B. Hereinafter, FIGS. 6A and 6B will be described with reference to FIGS. 1 and 5, and in the description of FIGS. 6A and 6B, descriptions previously given with respect to FIGS. 1 and 5 will be omitted.

Referring to FIG. 6A, operation S190a may include a plurality of operations S191a to S197a. In operation S191a, an initialization operation may be performed. For example, after the first period PER1 is started in operation S170 of FIG. 5, the variable CNT may be set to zero. As will be described later, the variable CNT may correspond to the number of times that the output current $I_{N1}$ is sensed to be equal to or greater than the first reference current $I_{REF1}$ during the first period PER1.

In operation S192a, the output current $I_{N1}$ may be compared with the first reference current $I_{REF1}$. When the portable device 20 is normally attached in the charger 10, the output current $I_{N1}$ may be greater than the first reference current $I_{REF1}$ in order to charge the battery 21 included in the portable device 20. The output current IN may fluctuate due to various factors in the attachment process of the portable device 20. Accordingly, the output current $I_{N1}$ may be periodically compared with the first reference current $I_{REF1}$ during the first period PER1, and the controller 11 may count the number of times that the output current $I_{N1}$ is identified as being equal to or greater than the first reference current $I_{REF1}$. In some example embodiments, the controller 11 may identify an output current $I_{N1}$ that is equal to or greater than the first reference current $I_{REF1}$ by a sensor included in the modem 13. In some example embodiments, operation S192a may be performed in a period of several tens of milliseconds (ms), and the first reference current $I_{REF1}$ may be about 2 mA. As shown in FIG. 6A, when the output current $I_{N1}$ is equal to or greater than the first reference current $I_{REF1}$, operation S193a may be subsequently performed, and the variable CNT may increase by 1 in operation S193a. On the other hand, when the output current $I_{N1}$ is less than the first reference current $I_{REF1}$, operation S194a may be subsequently performed.

In operation S194a, it may be determined whether the first period PER1 is ended. In some example embodiments, the controller 11 may determine whether the first period PER1 is ended based on the timer initialized in operation S170 of FIG. 5. In some example embodiments, the controller 11 may determine whether the first period PER1 is ended based on the number of times the output current $I_{N1}$ is compared to the first reference current $I_{REF1}$, that is, the number of times operation S192a is performed. As shown in FIG. 6A, when the first period PER1 is not ended, operation S192a may be subsequently performed again, and when the first period PER1 is ended, operation S195a may be subsequently performed.

In operation S195a, an operation of comparing the variable CNT with N may be performed (N is an integer greater than 1). In operation S195a, the variable CNT may correspond to the number of times that the output current $I_{N1}$ is identified as being equal to or greater than the first reference current $I_{REF1}$ during the first period PER1, and the controller 11 may determine the attachment state or detachment state based on the comparison result of the variables CNT and N. For example, during the first period PER1, the output current $I_{N1}$ and the first reference current $I_{REF1}$ may be compared 10 times, and in some example embodiments, N may be 3. As shown in FIG. 6A, when the variable CNT is greater than N, an attachment state may be determined in operation S196a and a transition to the attachment state STA3 of FIG. 2 may occur. On the other hand, when the variable CNT is less than or equal to N, the detachment state may be determined in operation S197a, and a transition to the detachment state STA1 of FIG. 2 may occur.

Referring to FIG. 6B, compared with operation S190a of FIG. 6A, in operation S190b of FIG. 6B whether to transition to the attachment state may be determined based on the voltage $V_{N1}$ of the first node N1 as well as the output current $I_{N1}$. As shown in FIG. 6B, operation S190b may include a plurality of operations S191b to S197b, and in operation S191b, the variable CNT may be initialized to zero.

In operation S192b, the output current $I_{N1}$ may be compared with the first reference current $I_{REF1}$, and the voltage $V_{N1}$ of the first node N1 may be compared with the first reference voltage $V_{REF1}$. When the portable device 20 is normally attached in the charger 10, the voltage of the first node N1 may be greater than or equal to a certain level while charging the battery 21 included in the portable device 20. Accordingly, not only the output current $I_{N1}$ but also the voltage $V_{N1}$ of the first node N1 may be used to determine whether or not to transition to the attachment state. The voltage $V_{N1}$ of the first node N1 may fluctuate due to various factors in the attachment process of the portable device 20. Accordingly, the voltage $V_{N1}$ of the first node N1 may be periodically compared with the first reference voltage $V_{REF1}$ during the first period PER1, and the controller 11 may count the number of times that the output current $I_{N1}$ is greater than or equal to the first reference current $I_{REF1}$ and the voltage $V_{N1}$ of the first node N1 is greater than or equal to the first reference voltage $V_{N1}$. In some example embodiments, the controller 11 may identify the voltage $V_{N1}$ of the first node N1 equal to or higher than the first reference voltage $V_{REF1}$ by a sensor included in the modem 13. In some example embodiments, different from that shown in FIG. 6B, the controller 11 may identify the voltage $V_{N1}$ of the first node N1 within a range defined by two reference voltages. As shown in FIG. 6B, when the output current $I_{N1}$ is equal to or greater than the first reference current $I_{REF1}$ and the voltage $V_{N1}$ of the first node N1 is equal to or greater than the first reference voltage $V_{REF1}$, operation S193b may be subsequently performed, and in operation S193b the variable CNT may be increased by one. On the other hand, when the output current $I_{N1}$ is less than the first reference current $I_{REF1}$ or the voltage $V_{N1}$ of the first node N1 is less than the first reference voltage $V_{REF1}$, operation S194b may be subsequently performed.

In operation S194b, it may be determined whether or not the first period PER1 ends, and in operation S195b, the variable CNT may be compared with N. In operation S195b, the variable CNT may correspond to the number of times it is identified that the output current $I_{N1}$ is greater than or equal to the first reference current $I_{REF1}$ and the voltage $V_{N1}$ of the first node N1 is greater than or equal to the first reference voltage $V_{REF1}$ during the first period PER1. As shown in FIG. 6B, when the variable CNT is greater than N, the attachment state may be determined in operation S196b, and while a transition to the attachment state STA3 of FIG. 2 may occur, when the variable CNT is N or less, the detachment state may be determined in operation S197b, and a transition to the detachment state STA1 of FIG. 2 may occur.

Figure 7:
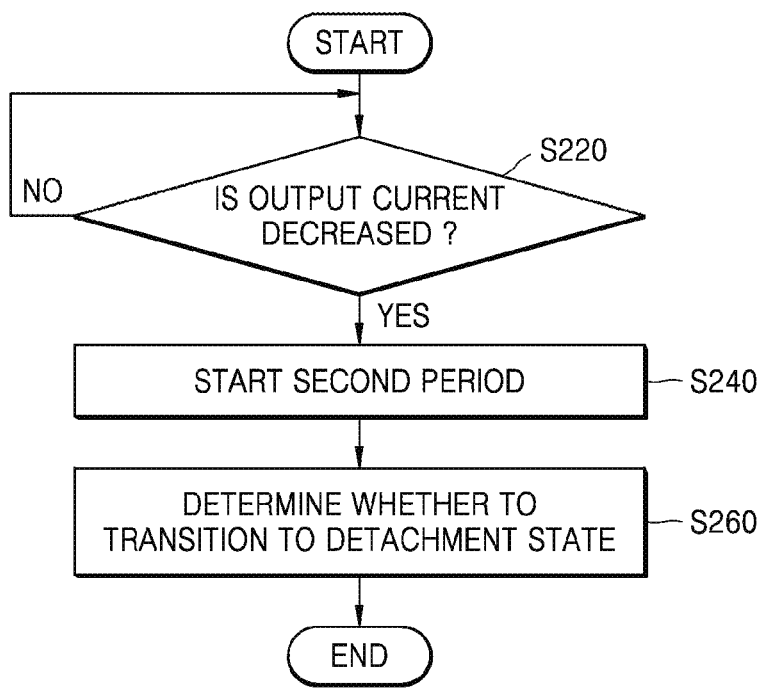
FIG. 7 is a flow chart showing a method of detecting detachment of a portable device according to example embodiments of the present disclosure.

FIG. 7 is a flowchart showing a method of detecting detachment of a portable device according to example embodiments of the present disclosure. As shown in FIG. 7, the method of detecting detachment of the portable device may include a plurality of operations S220, S240, and S260. In some example embodiments, the method of FIG. 7 may be performed by the charger 10 of FIG. 1 in an attachment state, and FIG. 7 will be described below with reference to FIG. 1.

In operation S220, it may be determined whether or not the output current $I_{N1}$ is decreased. For example, the controller 11 may identify a decrease in the output current $I_{N1}$ by a sensor included in the modem 13. In some example embodiments, when the output current $I_{N1}$ becomes the minimum value of the output current $I_{N1}$ that may occur while the portable device 20 is attached, for example, about 2 mA or less, the controller 11 may determine a decrease in the output current $I_{N1}$. As shown in FIG. 7, when a decrease in the output current $I_{N1}$ occurs, operation S240 may be subsequently performed.

In operation S240, the second period PER2 may be started. As described above with reference to FIG. 2, the second period PER2 may correspond to a period in which the detachment verification state STA4 is maintained. For example, the controller 11 may include a timer synchronized with the clock signal, and may start the second period PER2 by initializing the timer.

In operation S260, it may be determined whether to transition to the detachment state. For example, when the second period PER2 ends, the controller 11 may determine whether to transition to the detachment state based on the sensed output current $I_{N1}$ and/or the voltage $V_{N1}$ of the first node N1 during the second period PER2. Examples of operation S260 will be described later with reference to FIGS. 8A and 8B.

Figure 8A:
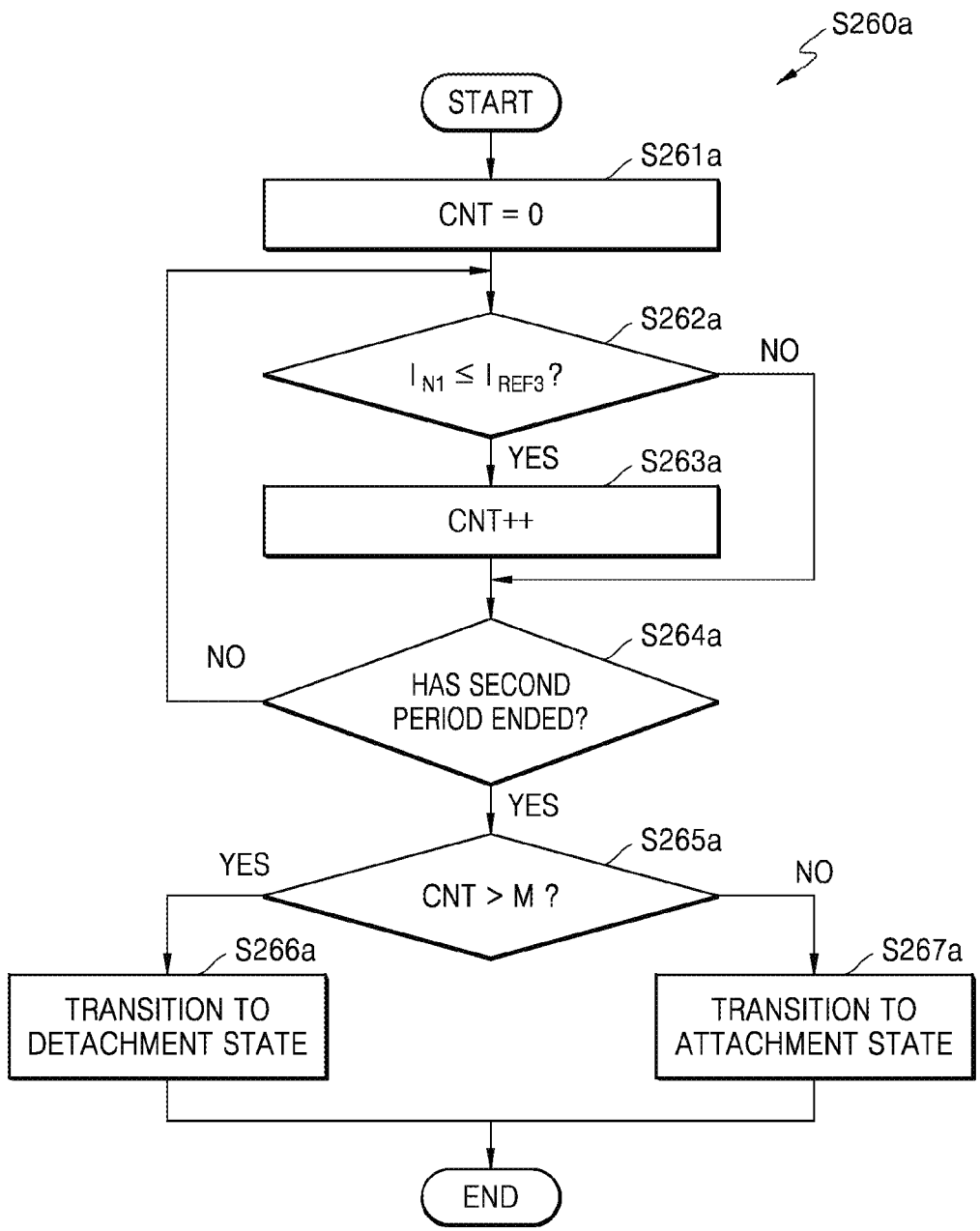
FIGS. 8A through 8B are flowcharts illustrating examples of a method of detecting detachment of a portable device according to example embodiments of the present disclosure.
Figure 8B:
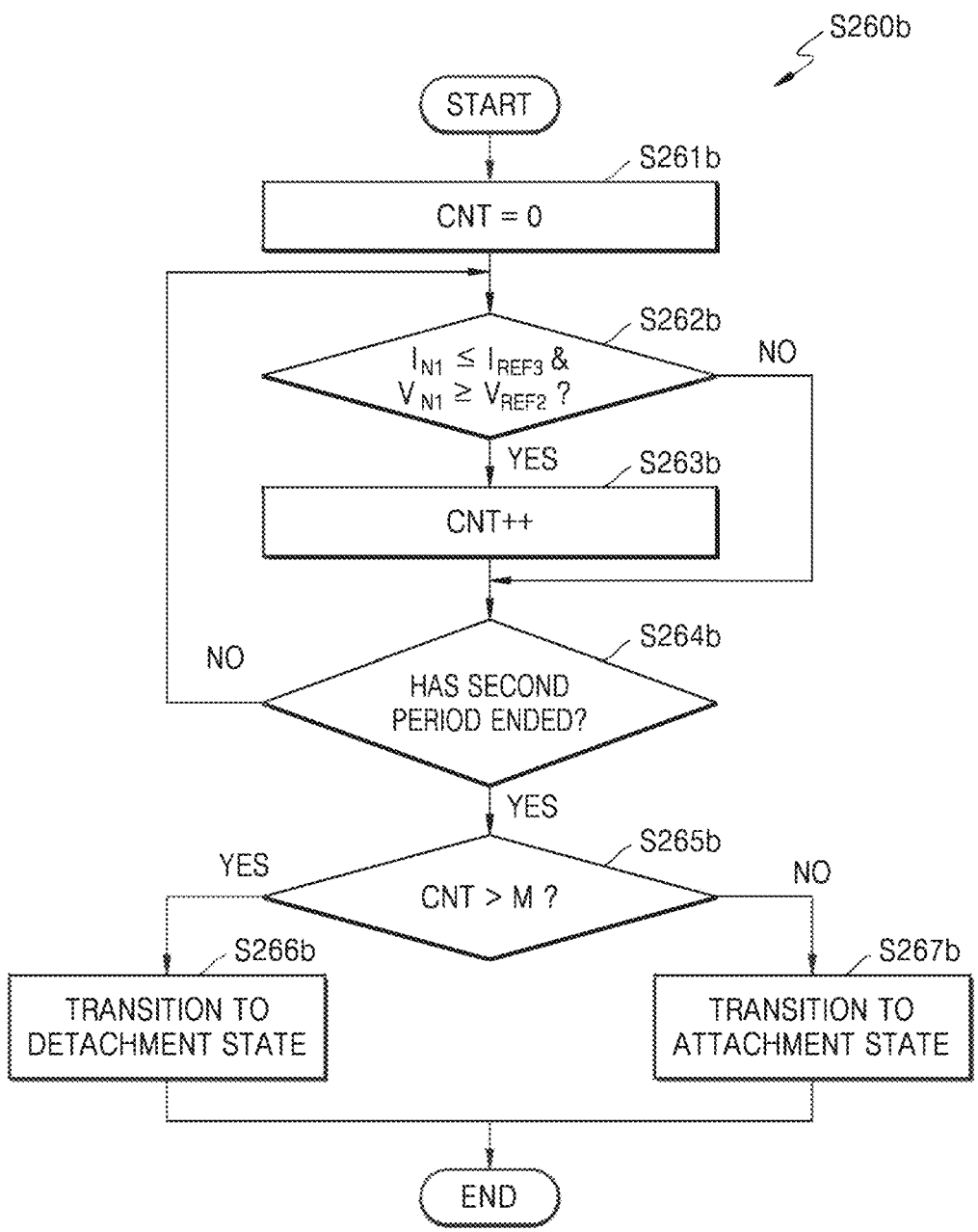

FIGS. 8A and 8B are flowcharts illustrating examples of a method of detecting detachment of a portable device according to example embodiments of the present disclosure. In detail, the flowcharts of FIGS. 8A and 8B illustrate examples of operation S260 of FIG. 7. As described above with reference to FIG. 7, when the second period PER2 ends, it may be determined whether a transition to the detachment state is performed in operation S260a of FIG. 8A and operation S260b of FIG. 8B. Hereinafter, FIGS. 8A and 8B will be described with reference to FIGS. 1 and 7, and in the description of FIGS. 8A and 8B, descriptions previously given with respect to FIGS. 1 and 7 will be omitted.

Referring to FIG. 8A, operation 260a may include a plurality of operations S261a to S267a. In operation S261a, an initialization operation may be performed. For example, after the second period PER2 is started in operation S240 of FIG. 7, the variable CNT may be set to zero. As will be described later, the variable CNT may correspond to the number of times that the output current $I_{N1}$ is sensed to be less than or equal to a third reference current $I_{REF3}$ during the second period PER2.

In operation S262a, the output current $I_{N1}$ may be compared with the third reference current $I_{REF3}$. When the portable device 20 is normally detached from the charger 10, the current supplied to the portable device 20 may be removed and the output current $I_{N1}$ may be smaller than the third reference current $I_{REF3}$. The output current $I_{N1}$ may fluctuate due to various factors in the detachment process of the portable device 20. Accordingly, the output current $I_{N1}$ may be periodically compared with the third reference current $I_{REF3}$ during the second period PER2, and the controller 11 may count the number of times the output current $I_{N1}$ is less than the third reference current $I_{REF3}$. In some example embodiments, the controller 11 may identify the output current $I_{N1}$ that is less than the third reference current $I_{REF3}$ by a sensor included in the modem 13. In some example embodiments, operation S262a may be performed every tens of milliseconds (ms). In some example embodiments, the third reference current $I_{REF3}$ may be smaller than the first reference current $I_{REF1}$ of FIG. 6A, and may be, for example, about 1 mA. As shown in FIG. 8A, when the output current $I_{N1}$ is less than the third reference current $I_{REF3}$, operation S263a may be subsequently performed, and the variable CNT may increase by 1 in operation S263a. On the other hand, when the output current $I_{N1}$ is greater than the third reference current $I_{REF3}$, operation S264a may be subsequently performed.

In operation S264a, it may be determined whether or not the second period PRE2 ends. In some example embodiments, the controller 11 may determine whether to end the second period PER2 based on the timer initialized in operation S240 of FIG. 7. In some practice cases, the controller 11 may determine whether or not the second period PER2 is ended based on the number of times the output current $I_{N1}$ is compared to the third reference current $I_{REF3}$, that is, the number of times operation S262a is performed As shown in FIG. 8A, when the second period PER2 is not ended, operation S262a may be subsequently performed again, while when the second period PER2 is ended, operation S265a may be subsequently performed.

In operation S265a, an operation of comparing the variable CNT with M may be performed (M is an integer greater than 1). In operation S265a, the variable CNT may correspond to the number of times that the output current $I_{N1}$ is identified as being equal to or less than the third reference current $I_{REF3}$ during the second period PER2, and the controller 11 may determine the attachment state or detachment state based on the comparison result of the variables CNT and M. For example, during the second period PER2, the output current $I_{N1}$ and the third reference current $I_{REF3}$ may be compared 10 times, and in some example embodiments, M may be 3. As shown in FIG. 8A, when the variable CNT is greater than M, the detachment state may be determined in operation S266a, and a transition to the detachment state STA1 of FIG. 2 may occur. On the other hand, when the variable CNT is equal to or less than M, the attachment state may be determined in operation S267a, and a transition to the attachment state STA3 of FIG. 2 may occur.

Referring to FIG. 8B, compared to operation S260a of FIG. 8A, in operation S260b of FIG. 8B, during the second period PER2, whether to transition to the detachment state may be determined based on the voltage $V_{N1}$ of the first node N1 as well as the output current $I_{N1}$. As shown in FIG. 8B, operation S260b may include a plurality of operations S261b to S266b, and in operation S261b, the variable CNT may be initialized to zero.

In operation S262b, the output current $I_{N1}$ may be compared with the third reference current $I_{REF3}$, and the voltage $V_{N1}$ of the first node N1 may be compared with a second reference voltage $V_{REF2}$. When the portable device 20 is normally detached from the charger 10, the current supplied to the portable device 20 may be cut off, thereby increasing the voltage $V_{N1}$ of the first node N1, and accordingly, not only the output current $I_{N1}$ but also the voltage $V_{N1}$ of the first node N1 may be used to determine whether to transition to the detachment state. The voltage $V_{N1}$ of the first node N1 may fluctuate due to various factors in the detachment process of the portable device 20. Accordingly, the voltage $V_{N1}$ of the first node N1 may be periodically compared with the second reference voltage $V_{REF2}$ during the second period PER2, and the controller 11 may count the number of times that the output current $I_{N1}$ is less than or equal to the third reference current $I_{REF3}$ and the voltage $V_{N1}$ of the first node N1 is greater than or equal to the second reference voltage $V_{REF2}$. In some example embodiments, the controller 11 may identify the voltage $V_{N1}$ of the first node N1 equal to or higher than the second reference voltage $V_{REF2}$ by a sensor included in the modem 13. In some example embodiments, different from that shown in FIG. 8B, the controller 11 may identify the voltage $V_{N1}$ of the first node N1 within a range defined by two reference voltages. As shown in FIG. 8B, when the output current $I_{N1}$ is less than or equal to the third reference current $I_{REF3}$ and the voltage $V_{N1}$ of the first node N1 is greater than or equal to the second reference voltage $V_{REF2}$, operation S263b may be subsequently performed, and the variable CNT may increase by one in operation S263b. On the other hand, when the output current $I_{N1}$ is greater than the third reference current $I_{REF3}$ or the voltage $V_{N1}$ of the first node N1 is less than the second reference voltage $V_{REF2}$, operation S264b may be subsequently performed.

In operation S264b, it may be determined whether or not the second period PRE2 ends, and in operation S265b, the variable CNT may be compared with M. In operation S265b, the variable CNT may correspond to the number of times it is identified that the output current $I_{N1}$ is less than or equal to the third reference current IRF3 and the voltage $V_{N1}$ of the first node N1 is greater than or equal to the second reference voltage $V_{REF2}$ during the second period PER2. As shown in FIG. 8B, when the variable CNT is greater than M, the detachment state may be determined in operation S266b, and a transition to the detachment state STA1 of FIG. 2 may occur, and when the variable CNT is M or less, the attachment state may be determined in operation S267b, and a transition to the attachment state STA3 of FIG. 2 may occur.

Figure 9:
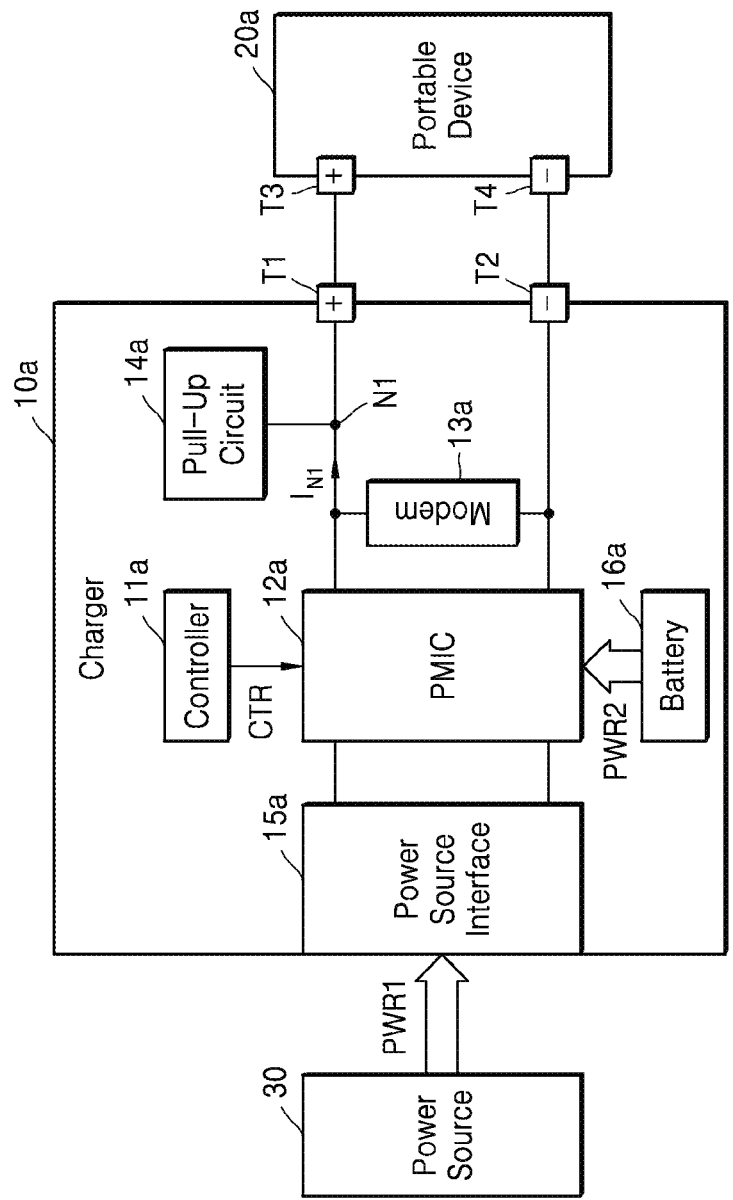
FIG. 9 is a block diagram illustrating a charger and a portable device according to example embodiments of the present disclosure.

FIG. 9 is a block diagram illustrating a charger 10a and a portable device 20a according to example embodiments of the present disclosure. In detail, the block diagram of FIG. 9 shows a power source 30 that supplies power to the charger 10a together with the charger 10a and the portable device 20a. Hereinafter, in the description of FIG. 9, descriptions previously given with respect to FIG. 1 will be omitted.

Referring to FIG. 9, similar to the charger 10 of FIG. 1, the charger 10a may include a controller 11a, a PMIC 12a, a modem 13a, a pull-up circuit 14a, and/or a power source interface 15a and include a first terminal T1 and a second terminal T2 respectively connected to the third terminal T3 and the fourth terminal T4 of the portable device 20a, and further include a battery 16a. The charger 10a may supply power to the portable device 20a based on the first power PWR1 provided from the power source 30 and/or the second power PWR2 provided from the battery 16a. For example, the controller 11a may be set to a first mode when the power source 30 is connected to the charger 10a, and may generate a control signal CTR so that the battery 16a is charged from the first power PWR1 provided through the power source interface 15a and power is supplied to the portable device 20a. In addition, the controller 11a may be set to the second mode when the power source 30 is not connected to the charger 10a (e.g., disconnected), and may generate a control signal CTR so that power is supplied to the portable device 20a from the second power PWR2 provided from the battery 16a. The PMIC 12a may operate in one of a plurality of modes in response to a control signal CTR provided by the controller 11a. As will be described below with reference to FIGS. 10A and 10B, events occurring in the mode switching process of the controller 11a and/or the PMIC 12a may be filtered to detect attachment and detachment of the portable device 20a.

Figure 10A:
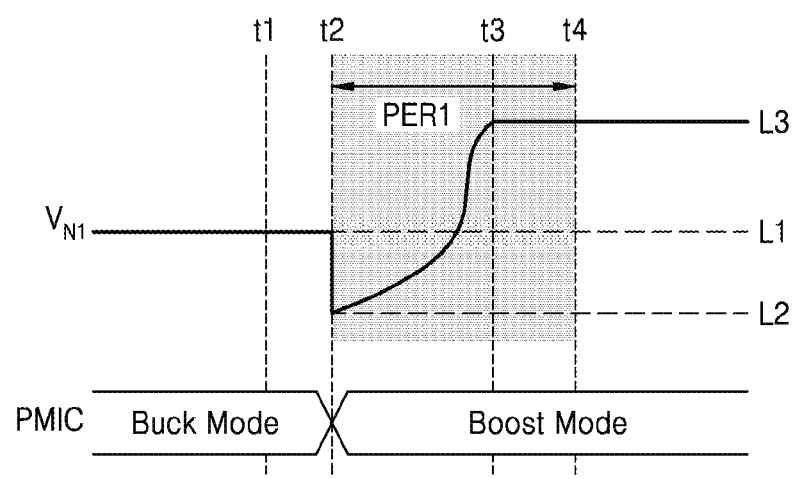
FIGS. 10A and 10B are timing diagrams illustrating examples of voltages of a first node according to example embodiments of the present disclosure.
Figure 10B:
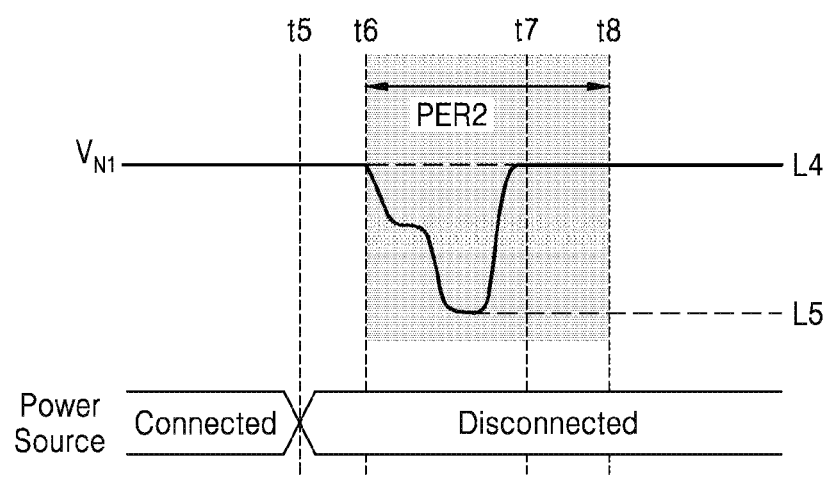

FIGS. 10A and 10B are timing diagrams illustrating examples of the voltage $V_{N1}$ of the first node N1 according to example embodiments of the present disclosure. The voltage $V_{N1}$ of the first node N1 may fluctuate due to various factors, and accordingly, the output current $I_{N1}$ may fluctuate. As described above, the first period PER1 and the second period PER2 may be set so that variations in the voltage $V_{N1}$ and the output current $I_{N1}$ of the first node N1, which are not caused by attachment and/or detachment of the portable device, are ignored. Hereinafter, FIGS. 10A and 10B will be described with reference to FIG. 9.

Referring to FIG. 10A, when the power source 30 is not connected to the charger 10a, that is, when the portable device 20a is attached in the second mode, the voltage $V_{N1}$ of the first node N1 may fluctuate. In some example embodiments, when the portable device 20a is detached from the charger 10a in the second mode, the PMIC 12a may block generation of an output voltage for charging the portable device 20a. For example, the PMIC 12a may operate in a buck mode to generate supply voltages provided to the internal components of the charger 10a from the second power PWR2 provided from the battery 16a. Accordingly, as illustrated in FIG. 10A, until time t1, the PMIC 12a may operate in a buck mode, and the voltage $V_{N1}$ of the first node N1 may have a first level L1.

At time t1, the portable device 20a may be attached on the charger 10a. Accordingly, the first terminal T1 may be pulled down. At time t2, the controller 11a may identify the voltage drop of the first terminal T1 and control the PMIC 12a to generate an output voltage. In addition, a transition to the attachment verification state STA2 of FIG. 2 may occur, and the first period PER1 may be started. When the portable device 20a is attached on the charger 10a in the second mode, the PMIC 12a may operate in a boost mode to generate an output voltage for charging the portable device 20a from the second power PWR2 provided from the battery 16a. Accordingly, as shown in FIG. 10A, the PMIC 12a may be switched from the buck mode to the boost mode, and in some example embodiments, the voltage $V_{N1}$ of the first node N1 may drop to the second level L2, and the output current $I_{N1}$ may also be reduced. Thereafter, the voltage $V_{N1}$ of the first node N1 may gradually increase, and at time t3, the voltage $V_{N1}$ of the first node N1 may reach the third level L3.

In order to reduce or prevent the transition to the detachment state STA1 from occurring, due to the voltage $V_{N1}$ and/or the output current $I_{N1}$ of the first node N1, which decreases when the PMIC 12a is switched from the buck mode to the boost mode, the first period PER1 may have a sufficient duration. For example, as shown in FIG. 10A, the first period PER1 may be defined as a period from time t2 to time t4, and accordingly, the first period PER1 may be terminated after time t3 when the voltage $V_{N1}$ of the first node N1 reaches the third level L3.

Referring to FIG. 10B, when the power source 30 is connected to the charger 10a or the power source 30 is disconnected from the charger 10a, the voltage $V_{N1}$ of the first node N1 may fluctuate. That is, when switching between the first mode and the second mode, the voltage $V_{N1}$ and/or the output current $I_{N1}$ of the first node N1 may fluctuate. As described above with reference to FIG. 9, the PMIC 12a may charge the battery 16a from the first power PWR1 in the first mode and supply power to the portable device 20a. Accordingly, as shown in FIG. 10B, until time t5, the PMIC 12a may generate the voltage $V_{N1}$ of the first node N1 having the fourth level L4 from the first power PWR1.

At time t5, the power source 30 may be disconnected from the charger 10a. At time t6, the controller 11a may identify the disconnection of the power source 30, and the control signal CTR may be generated so that the PMIC 12a supplies power to the portable device 20a from the second power PWR2. While the PMIC 12a generates an output voltage from the second power PWR2, the voltage $V_{N1}$ of the first node N1 may decrease, and the output current $I_{N1}$ may also decrease. Accordingly, a transition to the detachment verification state STA4 of FIG. 2 may occur, and the second period PER2 may be started as shown in FIG. 10B. Thereafter, the voltage $V_{N1}$ of the first node N1 may decrease to the fifth level L5 and then increase. At time t7, the voltage $V_{N1}$ of the first node N1 may again reach the fourth level L4.

In order to prevent a transition from the detachment verification state STA4 to the detachment state STA1 shown in FIG. 2 from occurring, due to the voltage $V_{N1}$ and/or the output current $I_{N1}$ of the first node N1, which decreases when the power source 30 is disconnected, the second period PER2 may have a sufficient duration. For example, as shown in FIG. 10B, the second period PER2 may be defined as a period from time t6 to time t8, and accordingly, the second period PER2 may be terminated after time t7 when the voltage $V_{N1}$ of the first node N1 reaches the fourth level L4.

Figure 11:
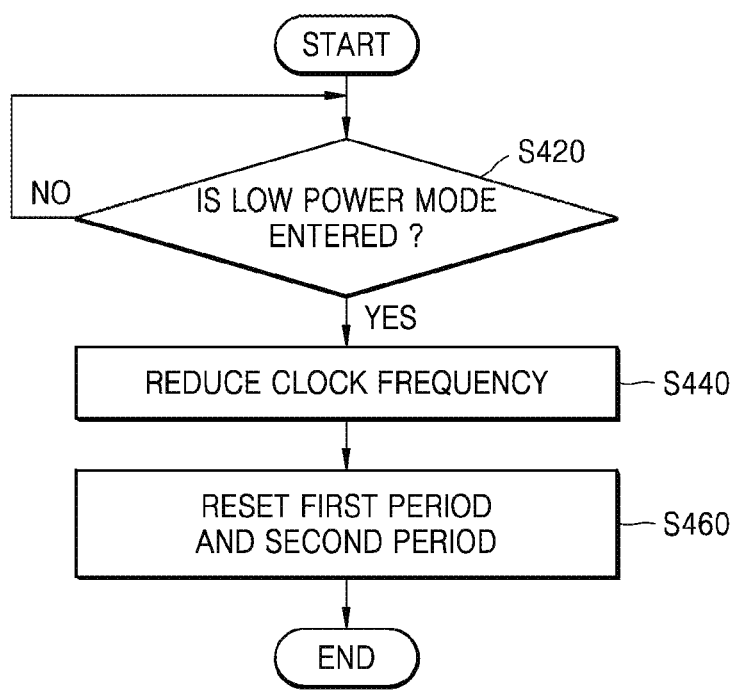
FIG. 11 is a flow chart showing a method of detecting attachment and detachment of a portable device according to example embodiments of the present disclosure.

FIG. 11 is a flowchart showing a method of detecting attachment and detachment of a portable device according to example embodiments of the present disclosure. As shown in FIG. 11, the method of detecting the attachment and detachment of the portable device may include a plurality of operations S420, S440, and S460. In some example embodiments, the method of FIG. 11 may be performed by the charger 10a of FIG. 9, and FIG. 11 will be described below with reference to FIG. 9.

In operation S420, it may be determined whether to enter the low power mode. For example, when the power source 30 is not connected to the charger 10a, the charger 10a may enter the low power mode when a certain condition is satisfied in order to reduce consumption of the second power PWR2. In some example embodiments, the controller 11a may enter the charger 10a from the normal mode to the low power mode, when the portable device 20a persists for a certain period or more in a detachment state, or when the portable device 20a is in an attachment state and a low current consumption of the portable device 20a lasts for a certain period or more. As shown in FIG. 11, when entering the low power mode, operation S440 may be performed.

In operation S440, the clock frequency may be reduced. For example, the controller 11a may operate in synchronization with the clock signal, and the frequency of the clock signal may decrease to reduce power consumption.

In operation S460, the first period PER1 and the second period PER2 may be reset. For example, the controller 11a may determine whether to end the first period PER1 and the second period PER2 based on the frequency of the clock signal. Accordingly, the controller 11a may reset the first period PER1 and the second period PER2 so that the durations of the first period PER1 and the second period PER2 are maintained despite the frequency of the clock signal reduced in operation S440. In addition, in some example embodiments, timings of events to be filtered in detecting the attachment and detachment of the portable device 20a may be changed in the low power mode, and the controller 11a may reset the first period PER1 and the second period PER2 based on the changed timings.

Figure 12:
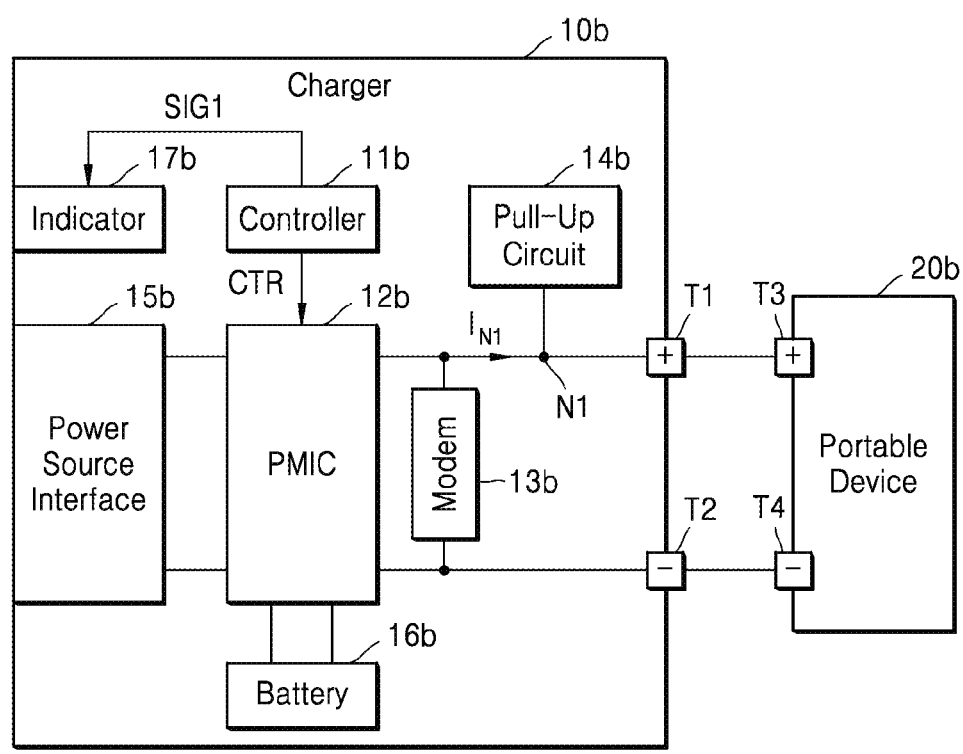
FIG. 12 is a block diagram illustrating a charger and a portable device according to example embodiments of the present disclosure.

FIG. 12 is a block diagram illustrating a charger 10b and a portable device 20b according to example embodiments of the present disclosure. As shown in FIG. 12, the first terminal T1 and the second terminal T2 of the charger 10b may be connected to the third terminal T3 and the fourth terminal T4 of the portable device 20b, respectively. The charger 10b may include a controller 11b, a PMIC 12b, a modem 13b, a pull-up circuit 14b, a power source interface 15b, and/or a battery 16b, similar to the charger 10a of FIG. 9, and may further include an indicator 17b. Hereinafter, in the description of FIG. 12, contents that overlap the description of FIGS. 1 and 9 will be omitted.

The indicator 17b may output the state of the charger 10b and/or the portable device 20b to the outside of the charger 10b. In some example embodiments, the indicator 17b may output light such as a light emitting diode (LED), may output sound such as a speaker or a buzzer, or may output vibration such as a motor.

The controller 11b may generate a first signal SIG1 for controlling the indicator 17b. For example, the controller 11b may generate the first signal SIG1 so that the indicator 17b indicates the charging state of the battery 16b included in the charger 10b and/or the charging state of the portable device 20b. When the controller 11b incorrectly recognizes the charging state of the portable device 20b during the attachment process and/or the detachment process of the portable device 20b, incorrect information may be provided to the user from the indicator 17b. The controller 11b may generate the first signal SIG1 so that accurate information may be provided to the user through the indicator 17b when the portable device 20b is attached and/or detached, and an example operation of the controller 11b will be described later with reference to FIG. 13.

Figure 13:
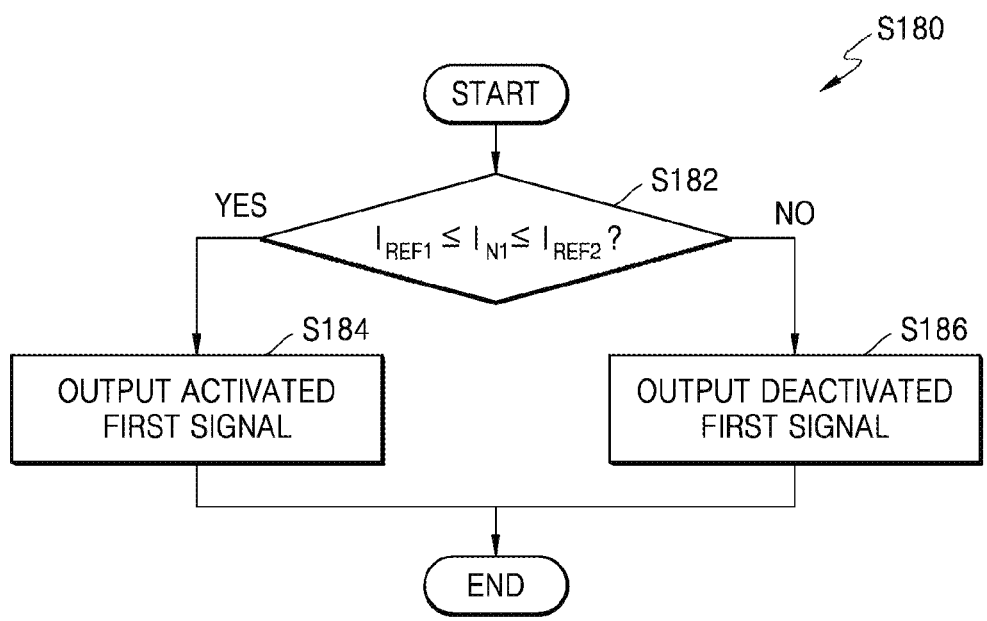
FIG. 13 is a flowchart showing a method of detecting attachment of a portable device according to example embodiments of the present disclosure.

FIG. 13 is a flowchart showing a method of detecting attachment of a portable device according to example embodiments of the present disclosure. In detail, the flowchart of FIG. 13 shows an operation S180 of controlling the indicator 17b of FIG. 12 when the attachment of the portable device 20 is detected. As shown in FIG. 13, operation S180 may include a plurality of operations S182, S184, and S186. In some example embodiments, operation S180 may be performed by the controller 11b of FIG. 12 between operations S170 and S190 of FIG. 5. In the following, FIG. 13 will be described with reference to FIG. 12.

In operation S182, the output current $I_{N1}$ may be compared with the first reference current $I_{REF1}$ and the second reference current $I_{REF2}$. When the battery included in the portable device 20b attached on the charger 10b is in a fully charged state, the output current $I_{N1}$ may decrease and may be less than or equal to the second reference current $I_{REF2}$. In some example embodiments, the second reference current $I_{REF2}$ may be about 6 mA. As shown in FIG. 13, when the output current $I_{N1}$ is greater than or equal to the first reference current $I_{REF1}$ and less than or equal to the second reference current $I_{REF2}$, operation S184 may be performed subsequently, while otherwise, operation S186 may be performed subsequently.

In operation S184, an activated first signal SIG1 may be output. For example, the indicator 17b may indicate that the battery included in the portable device 20b is in a fully charged state in response to the activated first signal SIG1, and when the portable device 20b including the battery in the fully charged state is attached, the controller 11b may immediately notify the user of the fully charged state of the battery included in the portable device 20b by generating the activated first signal SIG1.

In operation S186, a deactivated first signal SIG1 may be output. For example, when the portable device 20b including a battery that is not in the fully charged state is attached, the controller 11b may immediately notify the user of the state in which the battery included in the portable device 20b is being charged by generating the deactivated first signal SIG1. Accordingly, before the first period PER1 taken to verify the attachment state ends, the user may immediately identify the state of the battery included in the portable device 20b.

Figure 14:
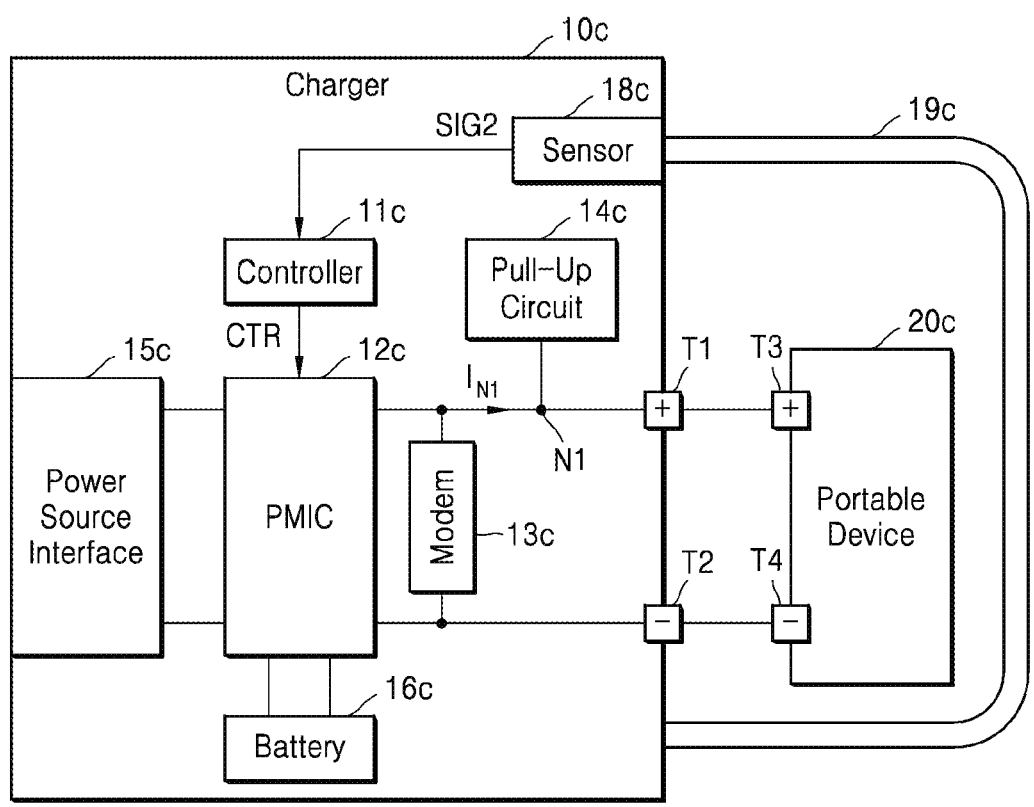
FIG. 14 is a block diagram showing a charger and a portable device according to example embodiments of the present disclosure.

FIG. 14 is a block diagram illustrating a charger 10c and a portable device 20c according to example embodiments of the present disclosure. As shown in FIG. 14, the first terminal T1 and the second terminal T2 of the charger 10c may be connected to the third terminal T3 and the fourth terminal T4 of the portable device 20c, respectively. Similar to the charger 10a of FIG. 9, the charger 10c may include a controller 11c, a PMIC 12c, a modem 13c, a pull-up circuit 14c, a power source interface 15c, and/or a battery 16c, and may further include a sensor 18c and/or a lid 19c. Hereinafter, in the description of FIG. 14, contents that overlap the description of FIG. 9 will be omitted.

The lid 19c may cover the portable device 20c when the portable device 20c is attached to the charger 10c, and accordingly, the charger 10c and the portable device 20c may be portable as one body. The portable charger 10c may be referred to as a portable charger, and the charger 10c and the portable device 20c may be collectively referred to as a portable system.

The sensor 18c may generate a second signal SIG2 by detecting the opening or closing of the lid 19c. For example, the sensor 18c may include a capacitive sensor, a magnetic sensor, an optical sensor, or the like.

The controller 11c may receive the second signal SIG2 from the sensor 18c and detect the attachment and detachment of the portable device 20c based on the second signal SIG2. For example, when a transition to the detachment verification state occurs from a closed state of the lid 19c, the controller 11c may determine the transition to the detachment state when harder conditions are satisfied. Further, when a transition to the attachment verification state occurs from the closed state of the lid 19c, the controller 11c may determine the transition to the attached state when harder conditions are satisfied. An example of an operation of detecting the attachment and detachment of the portable device 20c based on the second signal SIG2 will be described later with reference to FIG. 15.

Figure 15:
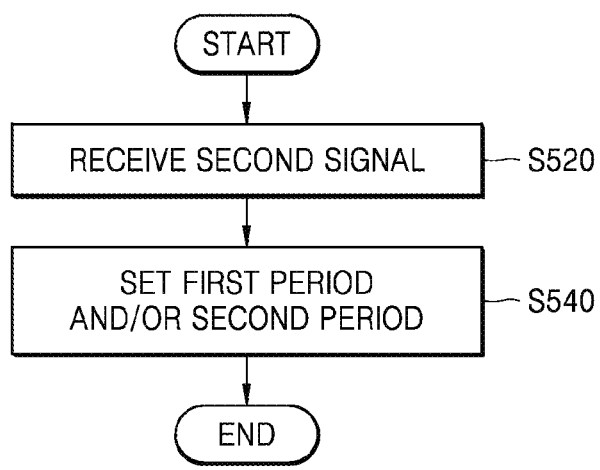
FIG. 15 is a flow chart illustrating a method of detecting attachment and detachment of a portable device according to example embodiments of the present disclosure.

FIG. 15 is a flowchart illustrating a method of detecting attachment and detachment of a portable device according to example embodiments of the present disclosure. In some example embodiments, the method of FIG. 15 may be performed by the controller 11c of FIG. 14, and FIG. 15 will be described below with reference to FIG. 14.

In operation S520, a second signal SIG2 may be received. As described above with reference to FIG. 14, the second signal SIG2 may be generated by the sensor 18c and may indicate opening and closing of the lid 19c. The controller 11c may identify the opening or closing of the lid 19c based on the second signal SIG2.

In operation S540, the first period PER1 and/or the second period PER2 may be set. As described above with reference to FIG. 14, the controller 11c may consider opening and closing of the lid 19c in detecting the attachment and detachment of the portable device 20c. For example, the controller 11c may extend the second period PER2 in order to make the condition for transition to the detachment state harder when a transition to the detachment verification state from the closed state of lid 19*c* occurs. In some example embodiments, controller 11*c* may increase M in FIGS. 8A and 8B. In addition, the controller 11*c* may extend the first period PER1 in order to make the condition for transition to the attachment state harder when a transition to the attachment verification state from the closed state of lid 19*c* occurs. In some example embodiments, the controller 11*c* may increase N in FIGS. 6A and 6B. In addition, the controller 11*c* may shorten the extended first period PER1 and/or the second period PER2 while the lid 19*c* is open, and may reduce N of FIGS. 6A and 6B and/or M of FIGS. 8A and 8B.

In some example embodiments, when the open lid 19*c* is closed while the portable device 20*c* is attached to the charger 10*c*, the charger 10*c* may reset the portable device 20*c*. Accordingly, the power consumed by the portable device 20*c* may fluctuate, and the output current $I_{N1}$ and the voltage $V_{N1}$ of the first node N1 may fluctuate. The controller 11*c* may reset the portable device 20*c* based on the second signal SIG2. On the other hand, the controller 11*c* may set the second period PER2 so that the fluctuation of the output current $I_{N1}$ and the voltage $V_{N1}$ of the first node N1 is not determined as detachment of the portable device 20*c*.

Figure 16:
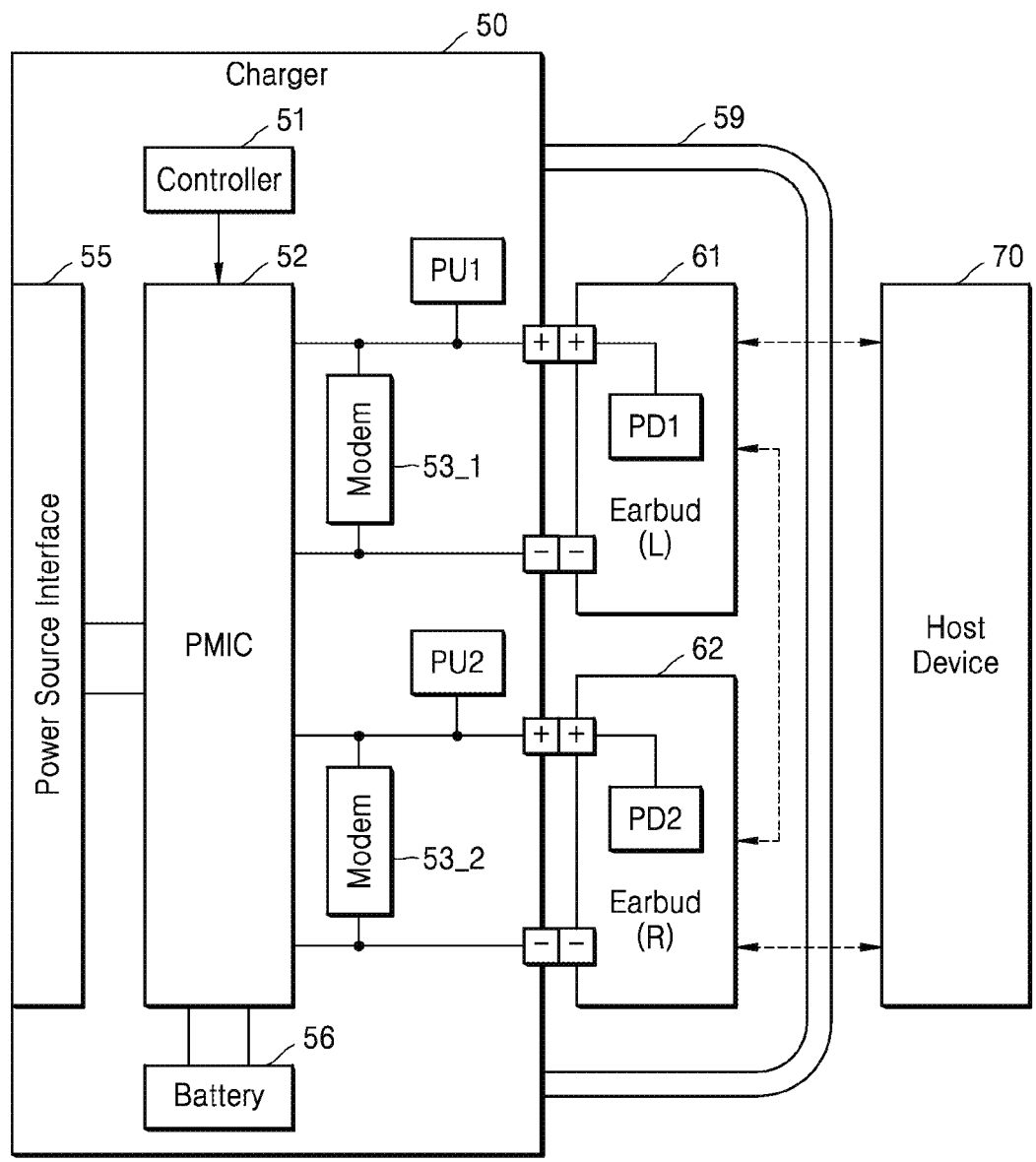
FIG. 16 is a block diagram showing a charger and a portable device according to example embodiments of the present disclosure.

FIG. 16 is a block diagram showing a charger and a portable device according to example embodiments of the present disclosure. In detail, the block diagram of FIG. 16 shows a cradle 50 as a charger, first and second earbuds 61 and 62 as a portable device, and a host device 70. Hereinafter, in the description of FIG. 16, contents that overlap the description of FIG. 9 will be omitted.

The first and second earbuds 61 and 62 may perform wireless communication with the host device 70 and may output sound from a source signal received from the host device 70. The host device 70 may be any device that provides the source signal to the first and second earbuds 61 and 62 through wireless communication such as Bluetooth. For example, the host device 70 may be a portable device such as a smart phone, a tablet PC, and a laptop PC, or may be a fixed device such as a TV, a multimedia player, and a desktop PC. In addition, the first and second earbuds 61 and 62 may perform wireless communication with each other. For example, the first and second earbuds 61 and 62 may perform wireless communication with each other for the purpose of synchronization and state transfer. Each of the first and second earbuds 61 and 62 may be attached to the cradle 50 and may include a battery charged from power supplied from the cradle 50.

The cradle 50 may function as a charger for the first and second earbuds 61 and 62, and may be portable. In some example embodiments, the cradle 50 may function as a case for the first and second earbuds 61 and 62. For example, the cradle 50 may have an internal structure to which the first and second earbuds 61 and 62 are attached, and a lid 59 may cover the attached first and second earbuds 61 and 62. As shown in FIG. 16, the cradle 50 may include a controller 51, a PMIC 52, first and second modems 53_1 and 53_2, first and second pull-up circuits PU1 and PU2, and a power source interface 55.

The controller 51 may detect attachment and detachment of the first and second earbuds 61 and 62 and may control the PMIC 52. The voltage pulled up by the first pull-up circuit PU1 may be dropped by the first pull-down circuit PD1 included in the first earbud 61, and the voltage pulled up by the second pull-up circuit PU2 may be dropped by the second pull-down circuit PD2 included in the second earbud 62. The controller 51 may initiate verification of the attachment of the first and second earbuds 61 and 62 based on voltage drops, and the attachment or detachment of the first and second earbuds 61 and 62 may be determined according to the verification result. In addition, the controller 51 may verify the detachment of the first and second earbuds 61 and 62 based on the output currents and/or output voltages of the PMIC 52, and the attachment or detachment of the first and second earbuds 61 and 62 may be determined according to the verification result. Accordingly, the attachment and detachment of the first and second earbuds 61 and 62 may be accurately detected, and an additional component for detecting the attachment and detachment of the first and second earbuds 61 and 62 in the cradle 50 may be omitted.

Figure 17:
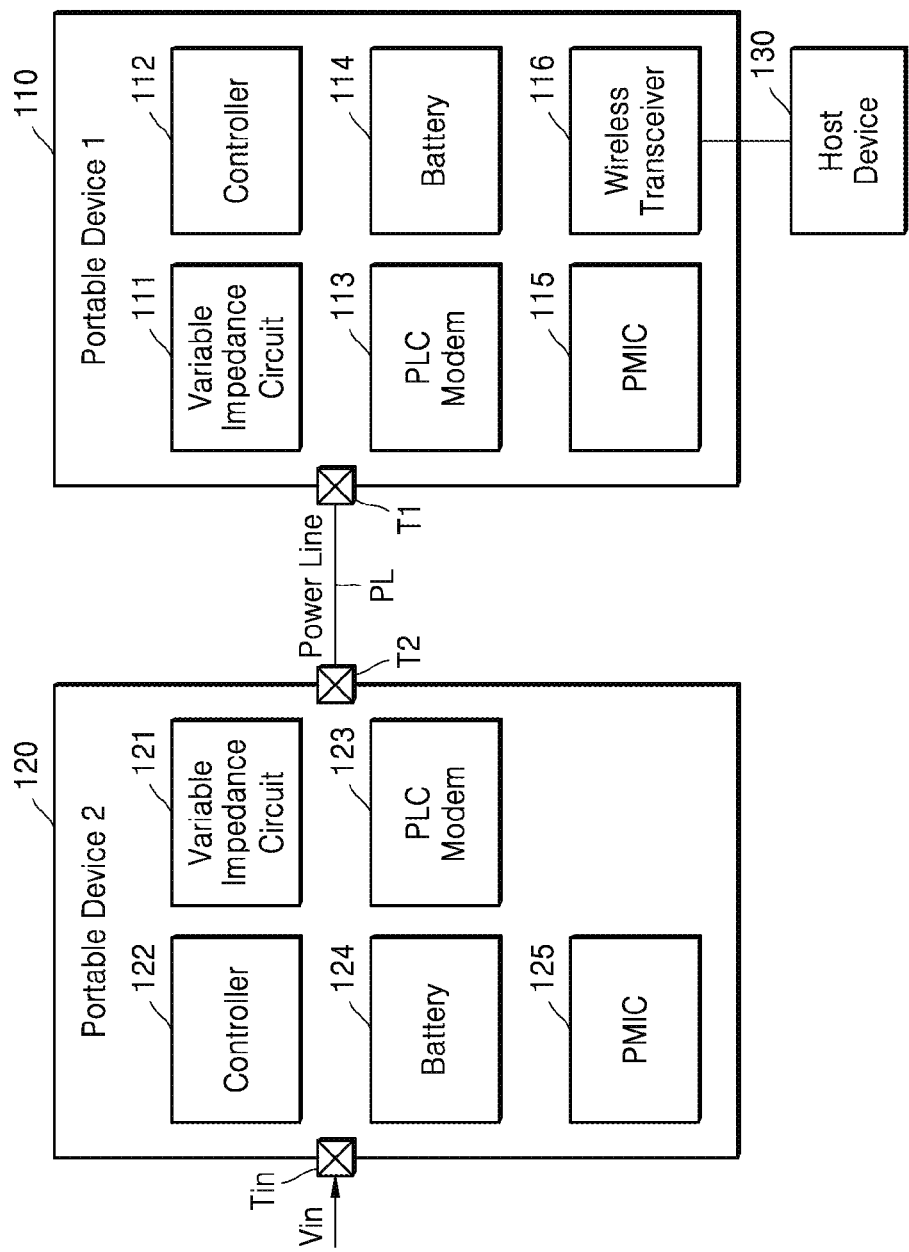
FIG. 17 is a block diagram showing a portable device according to example embodiments of the present disclosure.

FIG. 17 is a block diagram showing a portable device according to example embodiments of the present disclosure. Referring to FIG. 17, the first and second portable devices 110 and 120 may correspond to the portable device 20 and the charger 10 of FIG. 1, respectively.

The first portable device 110 may include a first terminal (T1), a variable impedance circuit 111, a controller 112, a PLC modem 113, a battery 114, a PMIC 115, and/or a wireless transceiver 116. In some example embodiments, the variable impedance circuit 111, the controller 112, the PLC modem 113, the battery 114, the PMIC 115, and the wireless transceiver 116 may be mounted on a printed circuit board. The PMIC 115 may manage power of the battery 114. In some example embodiments, the PMIC 115 may correspond to the PMIC 22 of FIG. 1. In some example embodiments, the first portable device 110 may further include a charger and a charging IC.

The wireless transceiver 116 may perform wireless communication with the host device 70. For example, the wireless transceiver 116 may include a Bluetooth module and may receive data from the host device 70. For example, the host device 70 is a non-limiting example, and may be a smart phone, a tablet PC, a PC, a smart TV, a mobile phone, a personal digital assistant (PDA), a laptop, a media player, a micro server, a global positioning system (GPS) device, an e-book terminal, a digital broadcasting terminal, a navigation device, a kiosk, an MP3 player, a digital camera, or other mobile or non-mobile computing devices. In addition, the host device 70 may be a wearable device such as a watch, glasses, hair band, and ring having a communication function and a data processing function. In some example embodiments, the wireless transceiver 116 of the first portable device 110 may provide data received from the host device 70 to the second portable device 120 through power line communication.

The second portable device 120 may include a second connection terminal T2, an input terminal Tin, a variable impedance circuit 121, a controller 122, a PLC modem 123, a battery 124, and a PMIC 125. In some example embodiments, a variable impedance circuit 121, a controller 122, a PLC modem 123, a battery 124, and a PMIC 125 may be included. The PMIC 125 may manage power of the battery 124. In some example embodiments, the PMIC 125 may correspond to the PMIC 12 of FIG. 1. In some example embodiments, the second portable device 120 may further include a converter that converts the input voltage Vin received through the input terminal Tin.

Figure 18:
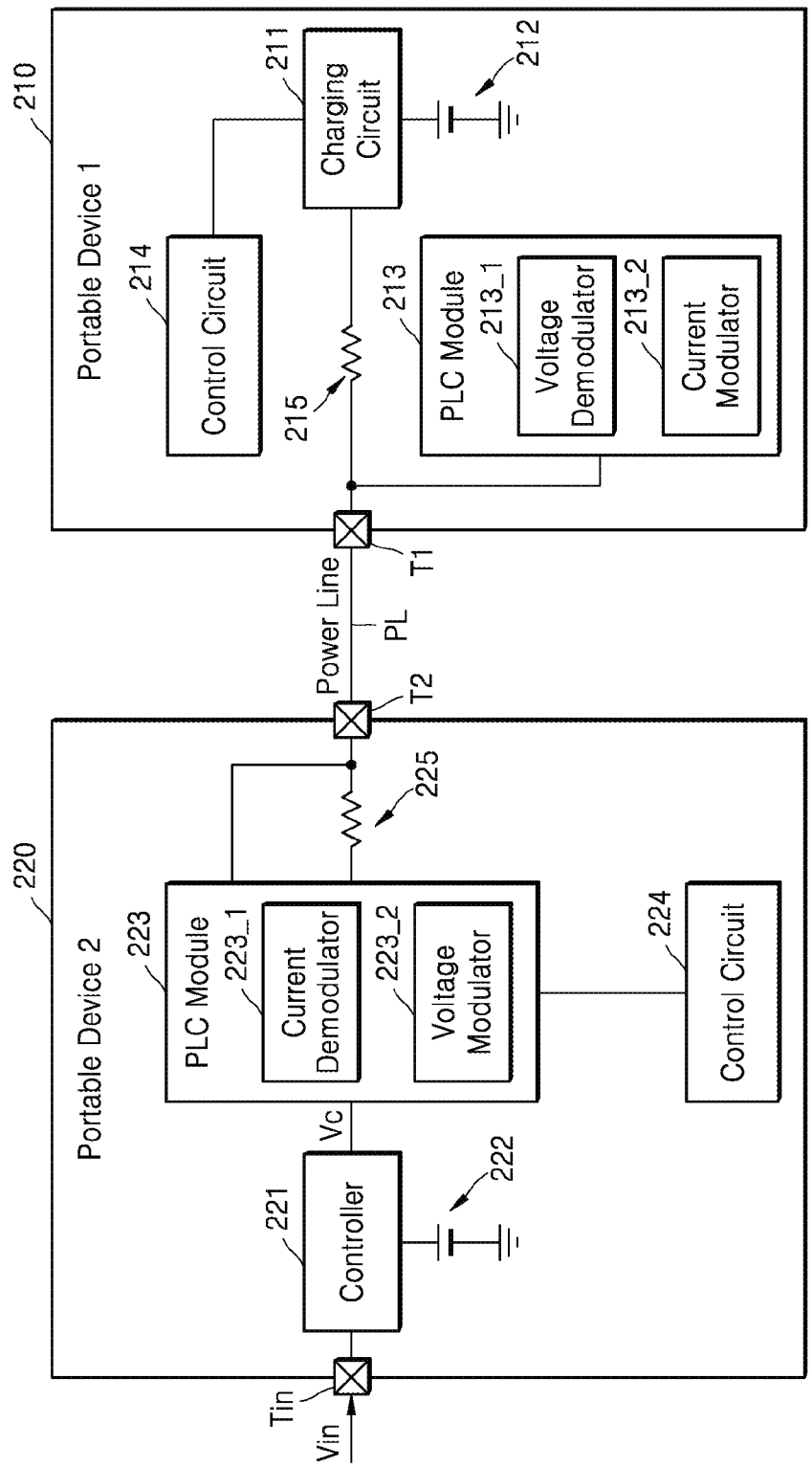
FIG. 18 is a block diagram showing a portable device according to example embodiments of the present disclosure.

FIG. 18 is a block diagram showing a portable device according to example embodiments of the present disclosure. Referring to FIG. 18, the first and second portable devices 210 and 220 may correspond to the portable device 20 and the charger 10 of FIG. 1, respectively.

The first portable device 210 may include a first terminal T1, an impedance circuit 215, a control circuit 214, a PLC module 213, a battery 212, and/or a charging circuit 211. In some example embodiments, the charging circuit 211 may be a linear charger, and may be implemented as an integrated circuit (IC). The control circuit 214 may enable the charging circuit 211 in the charging period, and may charge the battery 212 based on the power received through the power line PL. Also, in the data reception period, the control circuit 214 may disable the charging circuit 211, and the first portable device 210 may operate based on the power of the battery 212. In some example embodiments, the battery 212 may be charged based on the power received in the data transmission period.

The second portable device 220 may include a second connection terminal T2, an input terminal Tin, a converter 221, a battery 222, a PLC module 223, a control circuit 224, and/or an impedance circuit 225. The converter 221 may generate an input voltage Vin received through the input terminal Tin or a voltage Vc converted from the voltage of the battery 222. In some example embodiments, the converter 221 may include a switching regulator, and may include a boost converter and/or a buck converter or a buck-boost converter as a DC-DC converter. Also, the converter 221 may charge the battery 222 based on the input voltage Vin.

The PLC module 213 of the first portable device 210 may include a voltage demodulator 213_1 and a current modulator 213_2, and may further include a current source in some example embodiments. The current modulator 213_2 may perform current modulation under control by the control circuit 214. The current source may generate a modulated current signal (e.g., current pulse), and the current signal may be output through the first terminal T1. The voltage demodulator 213_1 may demodulate the voltage signal received through the first terminal T1 and may provide the demodulated signal to the control circuit 214.

The PLC module 223 of the second portable device 220 may include a current demodulator 223_1 and a voltage modulator 223_2. The control circuit 224 may control the current demodulator 223_1 and the voltage modulator 223_2. The voltage modulator 223_2 may generate a voltage signal modulated under control of the control circuit 224, and the voltage signal may be output through the second terminal T2. In some example embodiments, the voltage modulator 223_2 may include a linear regulator, such as a low drop-out (LDO) regulator. The current demodulator 223_1 may demodulate the current signal received through the second terminal T2 and may provide the demodulated signal to the control circuit 224.

Figure 19:
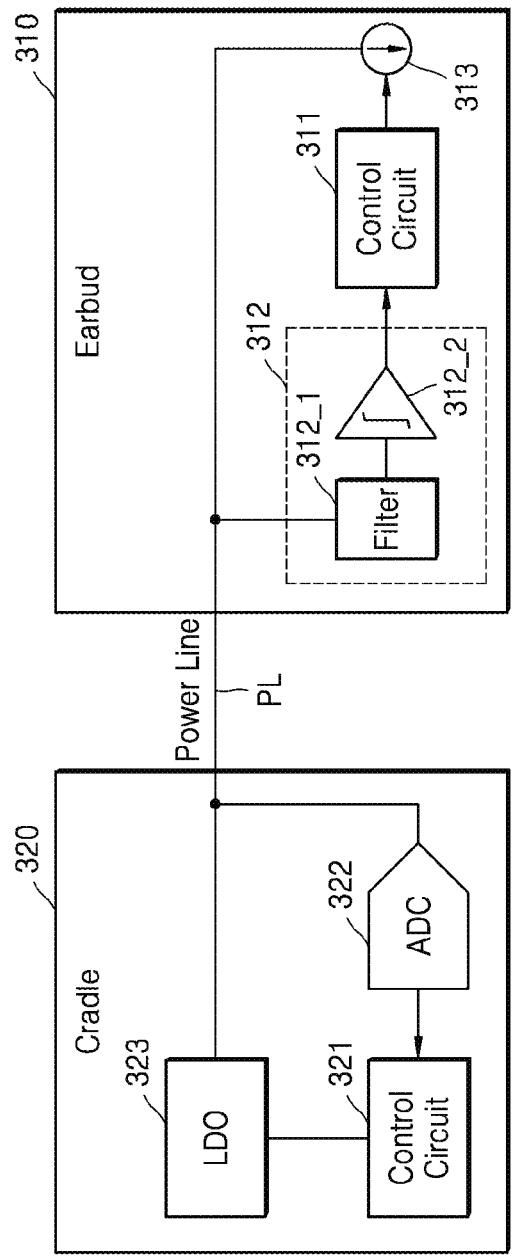
FIG. 19 is a block diagram showing a portable device according to example embodiments of the present disclosure.

FIG. 19 is a block diagram showing a portable device according to example embodiments of the present disclosure. Referring to FIG. 19, an earbud 310 and a cradle 320 may correspond to the portable device 20 and the charger 10 of FIG. 1, respectively.

The earbud 310 may include a control circuit 311, a voltage demodulator 312, and/or a current modulator 313, and the voltage demodulator 312 may include a filter 312_1 and/or an amplifier 312_2. The cradle 320 may include a control circuit 321, an analog-to-digital converter (ADC) 322, and/or an LDO regulator 323. The analog-to-digital converter (ADC) 322 may perform current demodulation, and the LDO regulator 323 may perform voltage modulation.

In the first portable device 310, the filter 312_1 of the voltage demodulator 312 may remove noise by blocking a specific frequency component of the voltage signal received through the power line PL, and may provide the filtered voltage signal to the amplifier 312_2. The amplifier 312_2 may generate a signal having a logic high level or a logic low level by amplifying the voltage signal, to provide the control circuit 311. The control circuit 311 may identify the information transmitted by the cradle 320 based on a signal received from the amplifier 312_2, and may generate a modulated current signal transmitted through the power line PL by controlling the current modulator 313 to transmit information to the cradle 320.

In the cradle 320, the analog-to-digital converter 322 may generate a digital signal from the current signal received through the power line PL and provide the generated digital signal to the control circuit 321. The control circuit 321 may identify information transmitted by the earbud 310 based on the digital signal. In addition, the control circuit 321 may generate a modulated voltage signal transmitted through the power line PL by controlling the LDO regulator 323.

While the inventive concepts have been particularly shown and described with reference to example embodiments thereof, it will be understood that various changes in form and details may be made therein without departing from the spirit and scope of the following claims.

What is claimed is:

1. A device for detecting an attachment and detachment of a portable device, the device comprising:
   a first terminal and a second terminal configured to be connected to the portable device;
   a pull-up circuit connected to the first terminal;
   a charging circuit configured to generate an output voltage for charging the portable device through the first terminal and the second terminal; and
   a controller configured to
      control the charging circuit to generate the output voltage when a voltage of the first terminal drops while the first terminal is pulled up by the pull-up circuit and the controller is in a detachment state, the drop in the voltage of the first terminal corresponding to a voltage drop that occurs when the portable device attaches to the device, and the detachment state being a first state of the controller corresponding to a determination that the portable device has detached from the device, and
      determine whether to transition to an attachment state based on an output current output from the charging circuit through the first terminal during a first period in which the output voltage is generated, the attachment state being a second state of the controller corresponding to a determination that the portable device is attached to the device,
      wherein the controller is configured to periodically compare the output current with a first reference current during the first period, count a first number of times the output current is equal to or greater than the first reference current and determine a transition to the attachment state when the first number of times is greater than a value greater than 1.

2. The detecting device of claim 1, wherein the controller is configured to output a first signal indicating that the portable device is in a fully charged state when the output current at a start of the first period is
   less than or equal to a second reference current, and
   greater than or equal to the first reference current, the second reference current being greater than the first reference current.

3. The detecting device of claim 2, wherein the controller is configured to periodically compare the voltage of the first terminal with a first reference voltage during the first period, and is configured to determine whether to transition to the attachment state further based on a number of times the voltage of the first terminal is equal to or greater than the first reference voltage.

4. The detecting device of claim 1, wherein
the charging circuit is configured to,
charge a battery and generate the output voltage based on power provided from an external power source in a first mode in which the charging circuit is connected to the external power source, and
generate the output voltage based on power provided from the battery in a second mode in which the charging circuit is disconnected from the external power source; and
the controller is configured to set the first period longer than a period in which a drop in the output voltage occurs when the portable device is attached in the second mode.

5. The detecting device of claim 1, wherein the controller is configured to switch between a normal mode and a low power mode, and is configured to set the first period to have the same duration in the normal mode and the low power mode.

6. The detecting device of claim 1, wherein the controller is configured to determine whether to transition from the attachment state to the detachment state based on the output current during a second period.

7. The detecting device of claim 6, wherein the controller is configured to periodically compare the output current with a third reference current during the second period, and determine whether to transition to the detachment state based on a number of times the output current is less than or equal to the third reference current.

8. The detecting device of claim 7, wherein
the charging circuit is configured to,
charge a battery and generate the output voltage based on power provided from an external power source in a first mode in which the charging circuit is connected to the external power source, and
generate the output voltage based on power provided from the battery in a second mode in which the charging circuit is disconnected from the external power source; and
the controller is configured to set the second period to be longer than a period in which a drop of the output voltage occurs when switching between the first mode and the second mode.

9. The detecting device of claim 6, wherein the controller is configured to periodically compare a voltage of the first terminal with a second reference voltage during the second period and determine whether to transition to the detachment state further based on a number of times the voltage of the first terminal is equal to or greater than the second reference voltage.

10. The detecting device of claim 6, wherein the controller is configured to receive a second signal indicating opening or closing of a lid covering an attached portable device, and to set the second period based on the second signal.

11. The detecting device of claim 1, further comprising a modem configured to perform power line communication with the portable device through the first terminal,
wherein the controller is configured to communicate with the portable device through the modem when determining a transition to the attachment state.

12. The detecting device of claim 11, wherein the modem includes a voltage sensor and a current sensor for the power line communication,
the voltage sensor is configured to detect the voltage drop, and
the current sensor is configured to sense the output current.

13. A portable system comprising:
a portable charger including a first terminal and a second terminal; and
a portable device including a third terminal and a fourth terminal configured to contact the first terminal and the second terminal respectively when attached to the portable charger, wherein
the portable device includes a pull-down circuit connected to the third terminal, and
the portable charger includes
a pull-up circuit connected to the first terminal,
a charging circuit configured to generate an output voltage for charging the portable device through the first terminal and the second terminal, and
a controller configured to initiate detection of attachment of the portable device when a voltage of the first terminal drops, the drop in the voltage of the first terminal corresponding to the pull-down circuit,
wherein the controller is configured to:
periodically compare an output current with a third reference current, the output current being output to the portable device through the first terminal during a second period in an attachment state of the portable device;
count a number of times the output current is equal to or less than the third reference current; and
determine a detachment of the portable device when the number of times is greater than a value greater than 1.

14. The portable system of claim 13, wherein the controller is configured to control the charging circuit to generate the output voltage when the voltage of the first terminal drops, and determine whether the portable device is attached based on an output current output through the first terminal during a first period in which the output voltage is generated.

15. A method of detecting an attachment and detachment of a portable device, the method comprising:
pulling up a first terminal configured to be connected to the portable device while a controller is in a detachment state, the detachment state being a first state of the controller corresponding to a determination that the portable device has detached;
sensing a voltage drop of the first terminal while the first terminal is pulled up and the controller is in the detachment state, the drop in the voltage of the first terminal corresponding to a voltage drop that occurs during attachment of the portable device;
outputting an output voltage for charging the portable device through the first terminal and a second terminal in response to the sensing the voltage drop, a first period starting contemporaneous with the outputting the output voltage; and
determining whether to transition to an attachment state based on an output current being generated by the output voltage and output through the first terminal during the first period, the attachment state being a second state of the controller corresponding to a determination that the portable device is attached,
wherein the determining whether to transition to the attachment state includes:
periodically comparing the output current with a first reference current during the first period;

periodically comparing a voltage of the first terminal with a first reference voltage during the first period;

counting a number of times the output current is greater than or equal to the first reference current and the voltage at the first terminal is greater than or equal to the first reference voltage; and determining a transition to the attachment state when the number of times is greater than a value greater than 1.

16. The method of claim 15, further comprising:

determining whether to transition to the detachment state based on the output current during a second period in the attachment state.

17. The method of claim 15, further comprising:

performing power line communication with the portable device through the first terminal when determining the transition to the attachment state.

* * * * *